United States Patent
Choo et al.

(10) Patent No.: US 10,579,854 B2
(45) Date of Patent: Mar. 3, 2020

(54) ELECTROLUMINESCENT DISPLAY DEVICE INTEGRATED WITH FINGERPRINT SENSOR

(71) Applicant: LG Display Co., Ltd., Seoul (KR)

(72) Inventors: Kyoseop Choo, Suwon-si (KR); Hongchul Kim, Anyang-si (KR); Hoon Kang, Goyang-si (KR); Buyeol Lee, Goyang-si (KR); Seungman Ryu, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 95 days.

(21) Appl. No.: 15/822,170

(22) Filed: Nov. 26, 2017

(65) Prior Publication Data

US 2018/0150671 A1    May 31, 2018

(30) Foreign Application Priority Data

Nov. 28, 2016  (KR) .................. 10-2016-0159568

(51) Int. Cl.
 *G06F 3/042*    (2006.01)
 *G09G 3/3233*    (2016.01)
 (Continued)

(52) U.S. Cl.
 CPC ......... *G06K 9/0004* (2013.01); *G06F 3/0412* (2013.01); *G06F 3/0416* (2013.01);
 (Continued)

(58) Field of Classification Search
 CPC .. G06K 9/0004; G06K 9/0006; G06F 3/0412; G06F 3/0416; G06F 3/044; H01L 24/04;
 (Continued)

(56) References Cited

U.S. PATENT DOCUMENTS 9,122,349 B1 * 9/2015 Chang .................. G09G 3/3413
9,754,150 B2 * 9/2017 Wu ....................... G06K 9/0004
(Continued)

FOREIGN PATENT DOCUMENTS

EP     2 827 283 A1   1/2015
JP    2004127272 A   4/2004
(Continued)

OTHER PUBLICATIONS

Extended European Search Report, dated Apr. 26, 2018 for the European patent application No. 17196794.6.
(Continued)

*Primary Examiner* — Sardis F Azongha
(74) *Attorney, Agent, or Firm* — Polsinelli PC

(57) ABSTRACT

An electroluminescent display device integrated with a fingerprint sensor comprises: a display panel comprising a plurality of display pixels; a transparent substrate bonded to the top of the display panel; and an image sensor bonded to the bottom of the display panel, wherein each of the display pixels in at least some part of the pixel array on the display panel comprises a light transmission area, the image sensor comprises a plurality of photosensors, one or more of the photosensors are exposed within the light transmission area, and the resolution of the image sensor is higher than or equal to the resolution of the display panel.

20 Claims, 15 Drawing Sheets

(51) Int. Cl.
*H01L 27/32* (2006.01)
*G06K 9/00* (2006.01)
*G06F 3/041* (2006.01)

(52) U.S. Cl.
CPC ......... *G06F 3/0421* (2013.01); *G09G 3/3233* (2013.01); *H01L 27/323* (2013.01); *H01L 27/326* (2013.01); *H01L 27/3234* (2013.01)

(58) Field of Classification Search
CPC ......... H01L 24/16; H01L 24/29; H01L 24/32; H01L 24/73; H01L 27/3223; H01L 27/323; H01L 51/0097; H01L 51/5253
See application file for complete search history.

(56) References Cited

U.S. PATENT DOCUMENTS

| | | | |
|---|---|---|---|
| 10,181,070 B2* | 1/2019 | Smith | G02B 5/005 |
| 2004/0125053 A1 | 7/2004 | Fujisaza | |
| 2004/0263069 A1 | 12/2004 | Yamazaki et al. | |
| 2007/0252005 A1 | 11/2007 | Konicek | |
| 2008/0150848 A1 | 6/2008 | Chung et al. | |
| 2009/0128508 A1 | 5/2009 | Sohn et al. | |
| 2010/0007632 A1 | 1/2010 | Yamazaki | |
| 2011/0050650 A1 | 3/2011 | McGibney et al. | |
| 2011/0122108 A1 | 5/2011 | Kozuma et al. | |
| 2011/0216042 A1 | 9/2011 | Wassvik et al. | |
| 2012/0162142 A1 | 6/2012 | Christiansson et al. | |
| 2014/0092052 A1* | 4/2014 | Grunthaner | G06F 3/044 345/174 |
| 2014/0098058 A1* | 4/2014 | Baharav | G06F 3/0421 345/174 |
| 2016/0216844 A1* | 7/2016 | Bergstrom | G06F 3/0421 |
| 2016/0247010 A1* | 8/2016 | Huang | G02B 5/20 |
| 2016/0266695 A1* | 9/2016 | Bae | G06F 1/1643 |
| 2017/0109564 A1* | 4/2017 | Seo | G06K 9/00067 |
| 2017/0161543 A1* | 6/2017 | Smith | G06K 9/0008 |
| 2017/0255809 A1* | 9/2017 | Huang | G06F 3/0414 |
| 2017/0270340 A1* | 9/2017 | Gao | G06F 3/0421 |
| 2017/0279948 A1* | 9/2017 | Hong | G06K 9/00013 |
| 2018/0046281 A1* | 2/2018 | Pi | A61B 5/02416 |

FOREIGN PATENT DOCUMENTS

| | | |
|---|---|---|
| JP | 2006267696 A | 10/2006 |
| JP | 2010020237 A | 1/2010 |
| JP | 2010040042 A | 2/2010 |
| JP | 2015038859 A | 2/2015 |
| WO | 2013/138003 A1 | 9/2013 |
| WO | 2015/108477 A1 | 7/2015 |
| WO | 2016/154378 A1 | 9/2016 |

OTHER PUBLICATIONS

Office Action with English translation dated Sep. 4, 2018 issued in the corresponding Japanese Patent Application No. 2017-218675, 6 Pages.

* cited by examiner $T_{CP\_AIR} < \alpha < T_{VHOE\_LR} < \theta$ ex) $45° < \alpha < 55°$
$70° < \theta < 75°$

LENS

ELECTROLUMINESCENT DISPLAY DEVICE INTEGRATED WITH FINGERPRINT SENSOR

This application claims the benefit of Korean Patent Application No. 10-2016-0159568 filed on Nov. 28, 2016, the entire contents of which is hereby incorporated herein by reference for all purposes as if fully set forth herein.

BACKGROUND

Field of the Disclosure

The present disclosure relates to a display device, and more particularly, to an electroluminescent display device integrated with a fingerprint sensor.

Description of the Background

Electroluminescent displays are roughly classified into inorganic light-emitting displays and organic light-emitting displays depending on the material of an emission layer. Of these, an active-matrix organic light emitting display comprises organic light-emitting diodes (hereinafter, "OLED") that emit light themselves, and has the advantages of fast response time, high luminous efficiency, high brightness, and wide viewing angle.

An OLED in an organic light-emitting display comprises an anode, a cathode, and organic compound layers formed between the anode and cathode. The organic compound layers comprise a hole injection layer HIL, a hole transport layer HTL, an emission layer EML, an electron transport layer ETL, and an electron injection layer EIL. When power is applied to the anode and the cathode, a hole passing through the hole transport layer HTL and an electron passing through the electron transport layer ETL move to the emission layer EML, forming an exciton. As a result, the emission layer EML generates visible light.

A fingerprint sensor is placed in a specific area, like the home button, outside the screen. The fingerprint sensor may be placed in a bezel area outside the screen, in which case the bezel area is wider. A structure of the display panel may be altered to place a fingerprint sensor on the display panel.

A fingerprint sensor may be placed on a liquid crystal display device (LCD). The fingerprint sensor is visible when situated between the display panel and a backlight unit (BLU), in a screen area. A prism sheet in the backlight unit BLU has many air gaps due to its structure, and this makes it difficult to place a fingerprint sensor under the display panel.

SUMMARY

The present disclosure provides an electroluminescent display device integrated with a fingerprint sensor that is capable of sensing a fingerprint on a screen where an input image is displayed.

An exemplary aspect of the present disclosure provides an electroluminescent display device integrated with a fingerprint sensor, comprising: a display panel comprising a plurality of display pixels; a transparent substrate bonded to the top of the display panel; and an image sensor bonded to the bottom of the display panel, wherein each of the display pixels in at least some part of the pixel array on the display panel comprises a light transmission area, the image sensor comprises a plurality of photosensors, one or more of the photosensors are exposed within the light transmission area, and the resolution of the image sensor is higher than or equal to the resolution of the display panel.

The electroluminescent display device further comprises a light source placed under one edge of the transparent substrate; a light-entering element that is placed between the light source and the transparent substrate and refracts light from the light source at an angle of total reflection within the transparent substrate; a light-exiting element that is placed between the display panel and the transparent substrate, on the screen of the display panel, and refracts part of the light traveling within the transparent substrate so that that part of the light traveling within the transparent substrate travels towards the display panel through the underside of the transparent substrate; and a low refractive index layer that is placed between the light-exiting element and the display panel and has a lower refractive index than the light-exiting element.

At least some of the display pixels emit light in sensor mode, and the light from the display pixels is reflected from a fingerprint on the transparent substrate and travels towards the image sensor through the light transmission areas.

The electroluminescent display device further comprises: one or more light sources bonded to the bottom of the display panel; and a light-entering element that is placed between the light source and the transparent substrate and refracts light from the light source at an angle of total reflection within the transparent substrate.

The electroluminescent display device further comprises a light focusing element that is placed between the display panel and the image sensor and focuses the light traveling towards the image sensor.

Another exemplary aspect of the present disclosure provides an electroluminescent display device integrated with a fingerprint sensor, comprising: a display panel comprising a plurality of display pixels; a transparent substrate bonded to the top of the display panel; and an image sensor bonded to the bottom of the display panel, wherein at least some of the display pixels are driven as photo sensors in a sensor mode, or photo sensors are embedded in the display panel, each of the display pixels in at least some part of the pixel array on the display panel comprises a light transmission area, the image sensor comprises a plurality of photosensors, one or more of the photosensors are exposed within the light transmission area, and the resolution of the image sensor is higher than or equal to the resolution of the display panel.

A further exemplary aspect of the present disclosure provides an electroluminescent display device integrated with a fingerprint sensor including a display panel comprising a plurality of display pixels, each display pixel disposed in at least some of pixel arrays comprising a light transmission area and sensing a fingerprint pattern; a transparent substrate attached to a top surface of the display panel; and an image sensor attached to a bottom surface of the display panel, comprising a plurality of photosensors and sensing a finger vein pattern, wherein at least one photosensor among the plurality of the photosensors is exposed within the light transmission area, and the image sensor has a resolution at least equal to a resolution of the display panel.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1A:
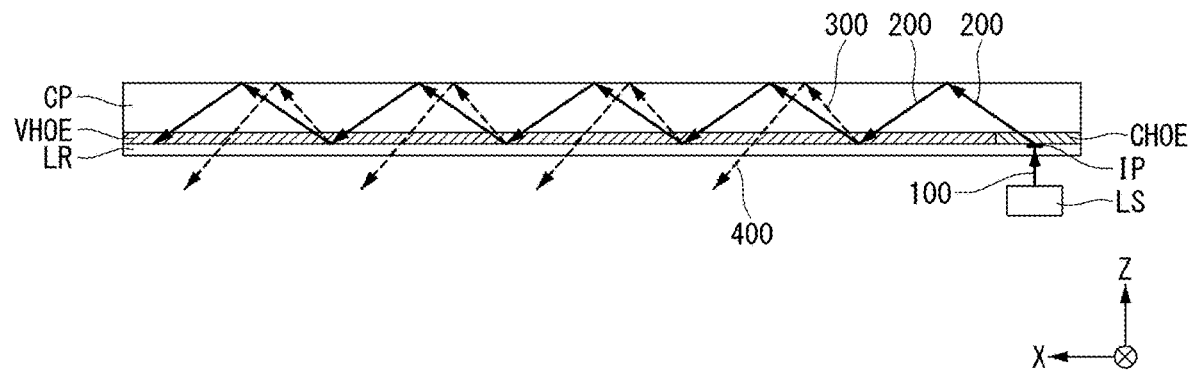
FIGS. 1A and 1B are a cross-sectional view and a plan view of a directional light source device, respectively according to an exemplary aspect of the present disclosure.

Various aspects and features of the present disclosure and methods of accomplishing them may be understood more readily by reference to the following detailed descriptions of exemplary aspects and the accompanying drawings. The present disclosure may, however, be embodied in many different forms and should not be construed as being limited to the exemplary aspects set forth herein. Rather, these exemplary aspects are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary aspects of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

Like reference numerals denote like elements throughout the specification.

The features of various exemplary aspects of the present disclosure may be coupled or combined with one another either partly or wholly, and may technically interact or work together in various ways. The exemplary aspects may be carried out independently or in connection with one another.

Hereinafter, various exemplary aspects of the present disclosure will be described in detail with reference to the accompanying drawings. In the following exemplary aspects, descriptions will be made with respect to an organic light-emitting display comprising organic light-emitting material. However, it should be noted that the technical spirit of the present disclosure is not limited to organic light-emitting displays but can be applied to inorganic light-emitting displays comprising inorganic light-emitting material.

Figure 1B:
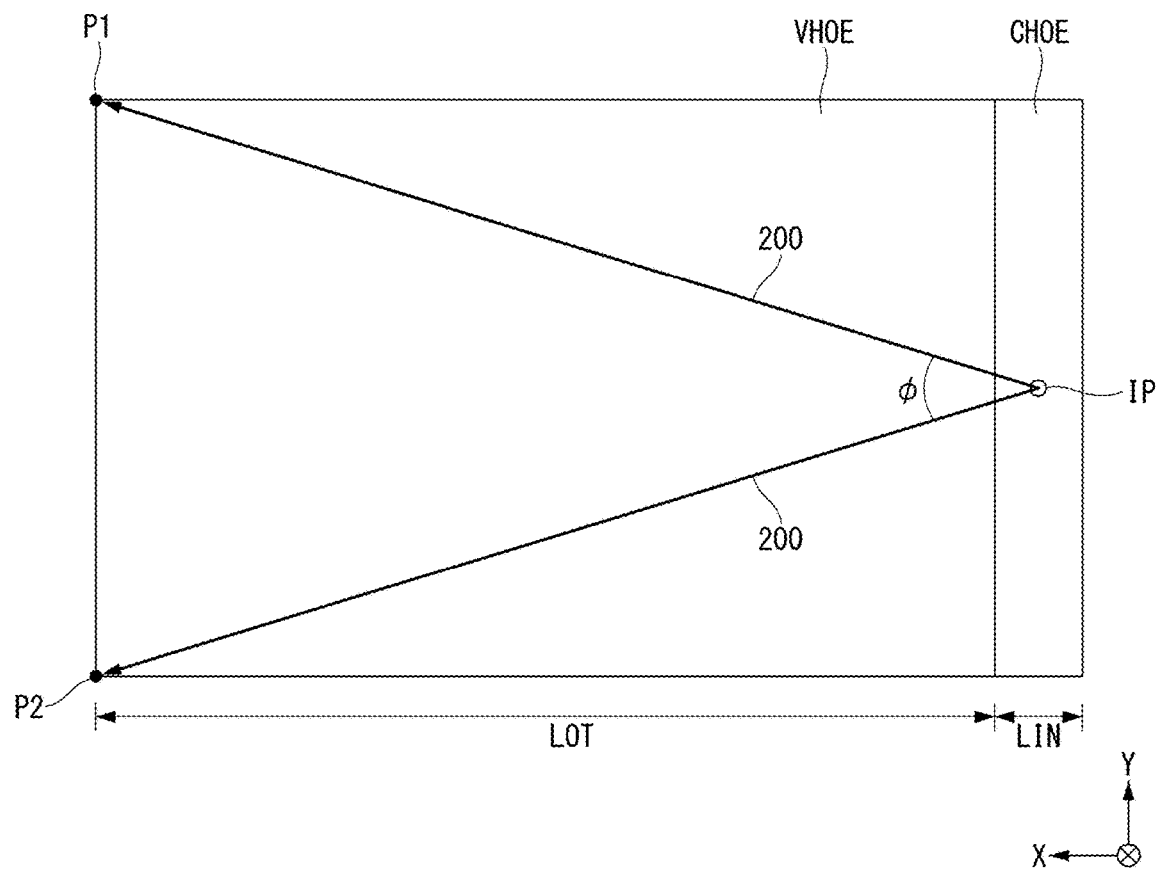
Figure 2:
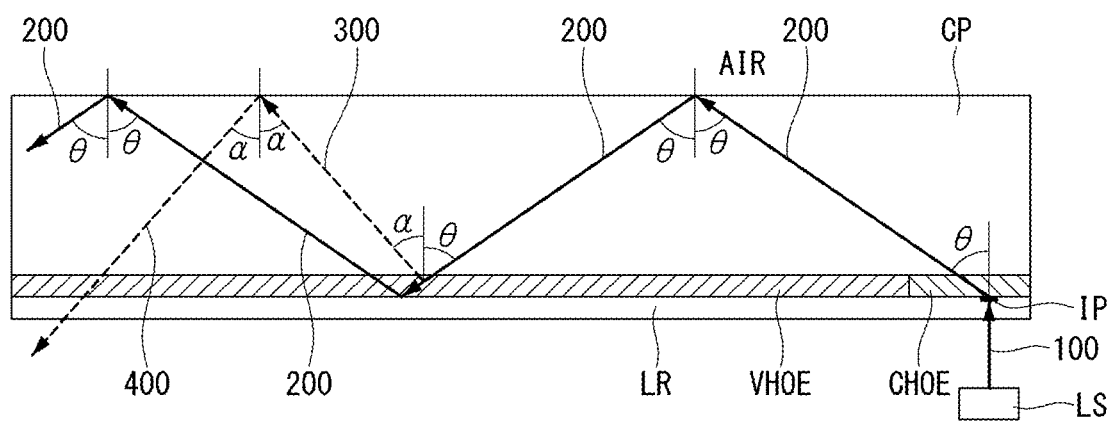
FIG. 2 is a cross-sectional view of a light path within a transparent substrate shown in FIG. 1.

In the present disclosure, a fingerprint may be sensed on a screen where an input image is displayed, by placing a directional light source device SLS shown in FIGS. 1 to 3 on a display panel and placing an image sensor under the display panel. When the user's fingerprint touches the directional light source device SLS, the light reflected from the fingerprint is converted into an electrical signal by the image sensor, thereby detecting a fingerprint pattern.

Figure 3A:
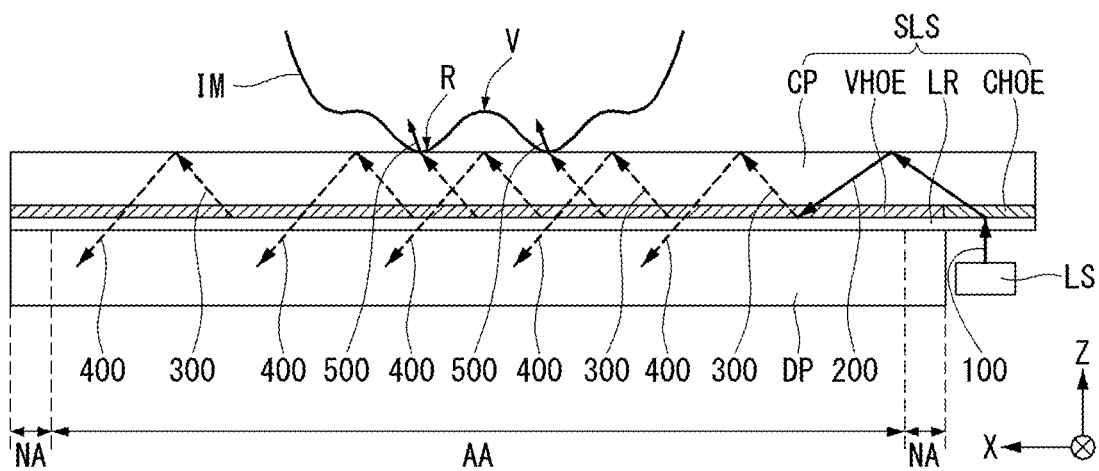
FIGS. 3A and 3B are a cross-sectional view and a plan view of a directional light source device situated on a display panel, respectively.
Figure 3B:
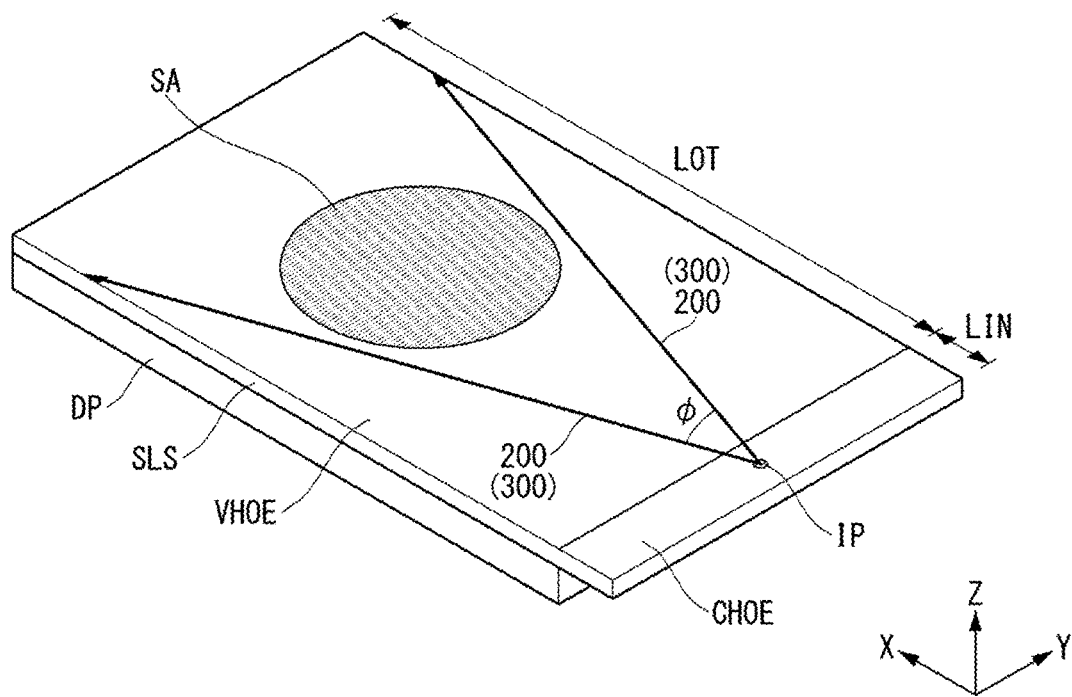

FIGS. 1A and 1B are a cross-sectional view and a plan view of a directional light source device SLS, respectively according to an exemplary aspect of the present disclosure. FIG. 2 is a cross-sectional view of a light path within a transparent substrate shown in FIG. 1. FIGS. 3A and 3B are a cross-sectional view and a plan view of a directional light source device SLS situated on a display panel DP, respectively.

Referring to FIG. 1A, the directional light source device SLS comprises a transparent substrate CP, a light source LS, a light-entering element CHOE, a light-exiting element VHOE, and a low refractive index layer LR.

The directional light source device SLS is an optical device that scatters collimated light over a large area within the transparent substrate CP. The light source LS provides collimated light. The light source LS projects laser beams in the infrared (IR) range to the light-entering element CHOE.

The light-entering element CHOE is placed between the light source LS and the transparent substrate CP, and refracts light from the light source LS at an angle of total reflection within the transparent substrate CP. The light-exiting element VHOE is placed between the display panel and the transparent substrate CP, on the screen of the display panel, and refracts part of the light traveling within the transparent substrate CP, so that that part of the light traveling within the transparent substrate CP travels towards the display panel through the underside of the transparent substrate CP. The low refractive index layer LR is placed between the light-exiting element VHOE and the display panel, and has a lower refractive index than the light-exiting element VHOE.

The light-exiting element VHOE and the light-entering element CHOE are bonded to the lower surface of the transparent substrate CP. The light-exiting element VHOE is an optical device that provides an outgoing beam 300. A pixel array is situated under the light-exiting element VHOE, on the screen of the display panel where an image is displayed.

The light-entering element CHOE is an optical device that makes collimated light from the light source LS have directionality while it spreads in the transparent substrate CP. The light-entering element CHOE may be situated at an edge of the display panel because it is not associated directly with image recognition. The light-entering element CHOE faces the light source LS.

The light-exiting element VHOE and the light-entering element CHOE are situated on the same plane. To take the manufacturing process into consideration, the light-exiting element VHOE and the light-entering element CHOE are formed in separate areas on a single film. The light-exiting element VHOE and the light-entering element CHOE each may be an optical element comprising a holographic pattern. In this case, a master film with a pattern of the light-exiting element VHOE and a master film with a pattern of the light-entering element CHOE may be placed adjacent to each other, and then the two holographic patterns may be duplicated simultaneously on a single holographic recording film.

The low refractive index layer LR is placed between the light-exiting element VHOE and light-entering element CHOE and the display panel. The low refractive index layer LR has a refractive index lower than the transparent substrate CP and the light-exiting element VHOE.

The transparent substrate CP may be made with a transparent substrate with a refractive index of 1.5. The light-exiting element VHOE and the light-entering element CHOE are a transparent holographic recording film having refractive index of equal to or slightly higher than that of the transparent substrate CP. Here, it is assumed that the refractive index of the light-exiting element VHOE and light-entering element CHOE is equal to the refractive index of the transparent substrate CP for convenience of explanation. The refractive index of the low refractive index layer LR may be similar to the refractive index of a target fingerprint IM, i.e., the skin. For example, the low refractive index layer LR may have a refractive index of about 1.4, which is close to 1.39—the refractive index of the human skin.

The light source LS is placed to face the light-entering element CHOE and provides highly-collimated light as lasers do.

An incident beam 100 of collimated light from the light source LS has a given cross-sectional area and is provided to an incident point IP defined on the light-entering element CHOE. The incident beam 100 enters in a direction normal to the surface of the incident point IP. However, the present disclosure is not limited to this, and if necessary, the incident beam 100 may enter at an oblique angle from the direction normal to the surface of the incident point IP.

The light-entering element CHOE refracts the incident beam 100 to convert it into a traveling beam 200 with an incident angle, and sends it to the inside of the transparent substrate CP. Here, the incident angle is greater than the internal total reflection critical angle of the transparent substrate CP. As a result, the traveling beam 200 is totally reflected within the transparent substrate CP and travels along the X-axis corresponding to the length of the transparent substrate CP.

The light-exiting element VHOE converts some of the traveling beam 200 into an outgoing beam 300 and refracts it off the lower surface of the transparent substrate CP. The remaining part of the traveling beam 200 is totally reflected and travels within the transparent substrate CP. The outgoing beam 300 is totally reflected off the upper surface of the transparent substrate CP but passes through the low refractive index layer LR on the lower surface. That is, the outgoing beam 300 is totally reflected off the upper surface of the transparent substrate CP and serves as a detection beam (or sensing beam) 400 that passes through the lower surface.

The outgoing beam 300 is emitted gradually by the light-exiting element VHOE as it travels from the light-entering element CHOE. In this case, the amount of light in the outgoing beam 300 is determined by the light extraction efficiency of the light-exiting element VHOE. For example, if the light extraction efficiency of the light-exiting element VHOE is 3%, 3% of the initial incident beam 100 is extracted as the outgoing beam 300, in a first light-emission region where the traveling beam 200 first touches the light-exiting element VHOE. 97% of the traveling beam 200 continues to be totally reflected and travel. Afterwards, in a second light-emission region, 2.91% of the initial incident beam 100, which equals 3% of the remaining 97%, is extracted as the outgoing beam 300.

In this way, the outgoing beam 300 is extracted until it reaches to the far edge of the transparent substrate CP. In order to keep the amount of light in the outgoing beam 300 constant as the traveling beam 200 travels, the light extraction efficiency of the light-exiting element VHOE may be designed to increase exponentially.

When viewed on the XZ plane (or 'vertical plane') consisting of axes along the length and thickness, the traveling beam 200 remains collimated as the incident beam 100 was. On the other hand, the traveling beam 200 has a spread angle ($\varphi$) on the XY plane (or 'horizontal plane') consisting of axes along the length and width, in order to provide an image detection area corresponding to the area of the transparent substrate CP. For example, the light-exiting element VHOE is situated corresponding to the entire area of a light output portion LOT if possible. Also, the spread angle ($\varphi$) is greater than or equal to the interior angle of two line segments connecting from the incident point IP to two end points P1 and P2 on the other side of the transparent substrate CP facing the light-entering element CHOE.

The region where the light-entering element CHOE is situated may be defined as a light input portion LIN. The region where the light-exiting element VHOE is situated may be defined as the light output portion LOT. Also, the light output portion LOT may be a light travel portion along which light travels.

For example, if the cross-sectional area of collimated light from the light source LS is 0.5 mm×0.5 mm, the light-entering element CHOE may have a length corresponding to the width of the transparent substrate CP and a width of around 3 mm to 5 mm. The light-entering element CHOE may be situated across the width of the transparent substrate CP.

Referring to FIG. 2, a description will be made about along which path within the transparent substrate CP collimated light from the light source LS is converted into a directional beam used for image detection.

The incident beam 100 from the light source LS enters in a direction normal to the surface of the incident point IP on the light-entering element CHOE. The light-entering element CHOE refracts the incident beam 100 to convert it into a traveling beam 200 with an incident angle ($\theta$), and sends it to the inside of the transparent substrate CP.

The incident angle ($\theta$) of the traveling beam 200 may be greater than the total reflection critical angle TVHOE_LR at the interface between the light-exiting element VHOE and the low refractive index layer LR. For example, if the transparent substrate CP and the light-exiting element VHOE have a refractive index of 1.5 and the low refractive index layer LR has a refractive index of 1.4, the total reflection critical angle TVHOE_LR at the interface between the light-exiting element VHOE and the low refractive index layer LR is around 69 degrees. Accordingly, the incident angle ($\theta$) is greater than 69 degrees. For example, the incident angle ($\theta$) may be set to range from 70 to 75 degrees.

The traveling beam 200 is totally reflected off the upper surface of the transparent substrate CP since the upper surface of the transparent substrate CP is in contact with an air layer AIR. This is because the total reflection critical angle TCP_AIR at the interface between the transparent substrate CP and the air layer AIR is around 41.4 degrees. That is, as long as the incident angle ($\theta$) is greater than the total reflection critical angle TVHOE_LR at the interface between the light-exiting element VHOE and the low refractive index layer LR, the incident angle ($\theta$) is always greater than the total reflection critical angle TCP_AIR at the interface between the transparent substrate CP and the air layer AIR.

The light-exiting element VHOE converts a certain amount of light in the traveling beam 200 into an outgoing beam 300 having a reflection angle ($\alpha$), and sends it back to the inside of the transparent substrate CP. The outgoing beam 300 is a beam for recognizing a pattern of a fingerprint IM touching the top of the transparent substrate CP. If there is no object on the surface of the transparent substrate CP, the outgoing beam 300 has to be totally reflected and sent to the optical fingerprint sensor situated under the directional light source device SLS. The outgoing beam 300, after totally reflected off the upper surface of the transparent substrate CP, serves as a detection beam 400, which propagates under the directional light source device SLS.

The optical fingerprint sensor bonded to the bottom of the display panel is capable of distinguishing a fingerprint pattern image on the transparent substrate CP by receiving the detection beam 400.

FIGS. 3A and 3B are a view of a light path with the display panel DP being situated under the directional light source device SLS.

Referring to FIGS. 3A and 3B, an incident beam 100 is converted into a traveling beam 200 by the light-entering element CHOE. The traveling beam 200 is converted in such a way that it has a spread angle ($\varphi$) on the XY plane, which is a horizontal plane consisting of an X-axis along the length and a Y-axis along the width. Also, the traveling beam 200 remains collimated, as it originally was, on the XZ plane, which is a vertical plane consisting of an X-axis along the length and a Z-axis along the thickness.

The spread angle ($\varphi$) may be greater than or equal to the interior angle of two line segments connecting from the incident point IP to two end points on the other side of the transparent substrate CP facing the light-entering element CHOE. In this case, the traveling beam 200 travels as it spreads out in a triangle with a spread angle ($\varphi$). The outgoing beam 300 is provided over the same area as the traveling beam 200. As a result, an image sensing area may be within the triangle. Accordingly, in a fingerprint recognition device, a sensing area SA may be set to correspond to a striped circle.

If the sensing area SA is formed at the center of the display panel DP or at a part of the upper edge of the display panel DP, facing the light-entering element CHOE, the amount of light in the outgoing beam 300 is largest in the sensing area SA. To this end, the light extraction efficiency of the light-exiting element VHOE may be designed as a function of position so that it is highest in the part corresponding to the sensing area SA and lowest or close to zero in the other parts.

When a fingerprint touches onto the transparent substrate CP, the light on the valleys of the fingerprint is reflected from the surface of the transparent substrate CP, and this light passes through the light-exiting element VHOE and the low refractive index layer LR and travels towards the display panel CP. The light on the ridges of the fingerprint touching the transparent substrate CP is transmitted out through the skin.

In the present disclosure, as shown in FIGS. 3A and 3B, an image sensor is placed under the sensing area SA to increase the light reception efficiency of the image sensor and to display an image indicating the position of the image sensor on the screen so that the user can easily notice it. The image sensor may be embedded in the display panel or may be placed under the display panel in such a way that it faces the sensing area SA, or may be placed under the display panel.

Figure 4:
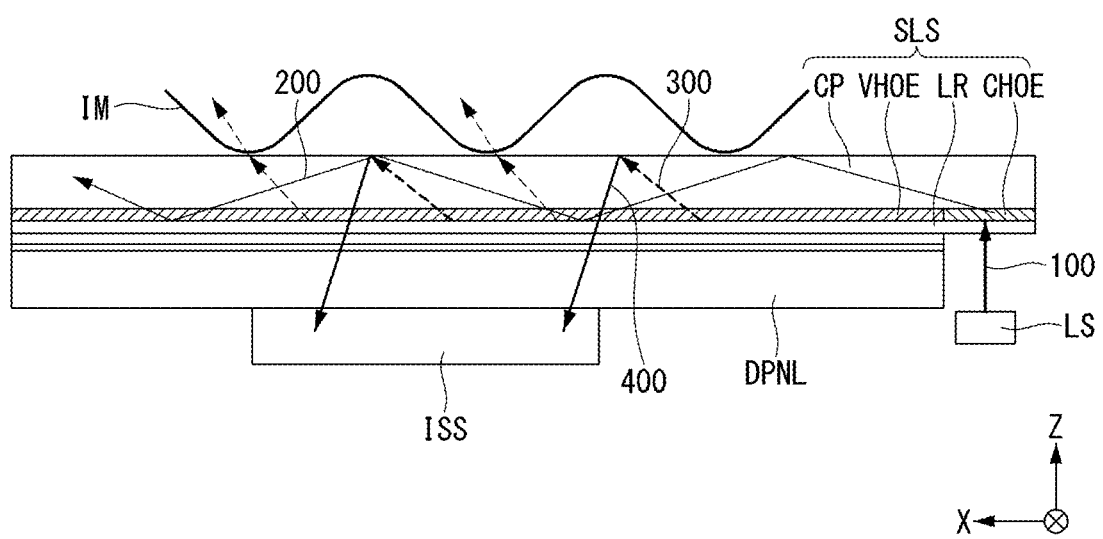
FIG. 4 is a cross-sectional view of an electroluminescent display device according to a first exemplary aspect of the present disclosure.
Figure 5:
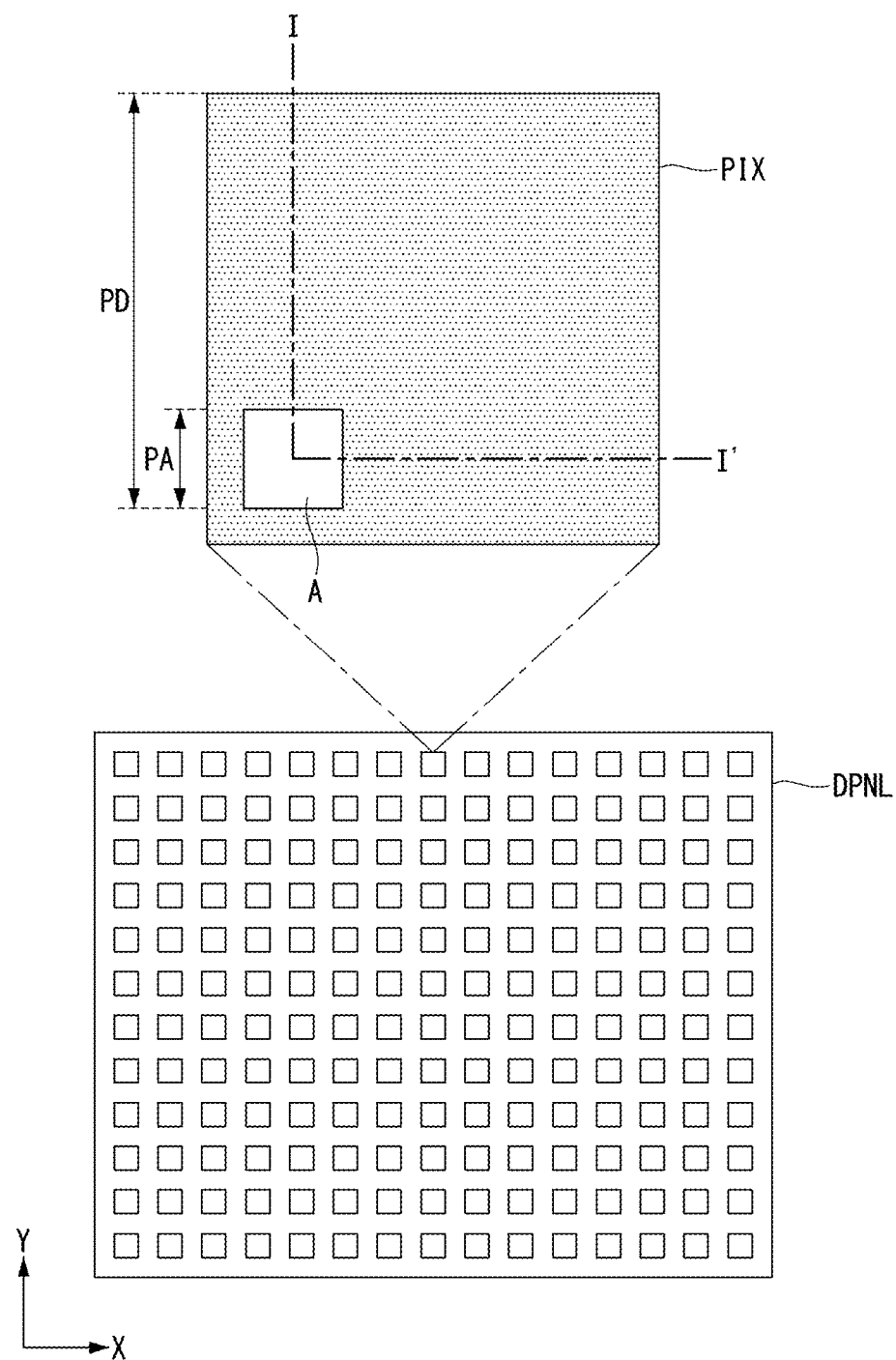
FIG. 5 is a view showing light transmission areas formed within display pixels on a display panel.
Figure 6:
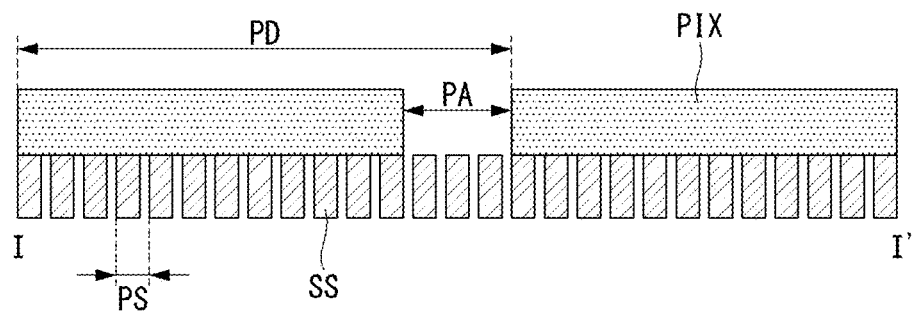
FIG. 6 is a cross-sectional view of the display panel taken along line I-I' of FIG. 5.

FIG. 4 is a cross-sectional view of an electroluminescent display device according to a first aspect of the present disclosure. FIG. 5 is a view showing light transmission areas formed within display pixels on a display panel. FIG. 6 is a cross-sectional view of the display panel taken along the line I-I' of FIG. 5.

Referring to FIGS. 4 to 6, the directional light source device SLS is placed on the display panel DPNL. The light-exiting element VHOE and the low refractive index layer LR are placed on the display panel DPNL. The low refractive index layer LR may be bonded onto the display panel DPNL with an optical clear adhesive OCA.

An image sensor ISS is bonded to a substrate of the display panel DPNL with an adhesive such as an optical clear adhesive OCA or a pressure sensitive adhesive PSA. The image sensor ISS is situated opposite the transparent substrate CP, light-exiting element VHOE, and low refractive index layer LR, with the display panel DPNL in between. Thus, light reflected from a fingerprint is received by the image sensor ISS through the display panel DPNL. The image sensor ISS comprises a plurality of photosensor pixels (hereinafter, "sensor pixels"). Each sensor pixel SS converts the light reflected from the fingerprint to a voltage by using a photodiode for converting light into an electrical signal, and then converts the voltage to digital data by amplifying the voltage.

To secure a path of light that passes through the display panel DPNL and travels towards the image sensor ISS, light transmission areas A are formed in the display pixels PIX on the display panel DPNL, as shown in FIGS. 5 and 6. A light transmission area A may be formed in each of the display pixels PIX in at least some part, e.g., the sensing area SA, of the screen. The light transmission area A is an area with no metal or black matrix present within a display pixel PIX. One or more sensor pixels SS are placed in the light transmission area A. Some of the sensor pixels SS are blocked by a light-blocking or light-absorbing medium of the display pixels PIX and therefore not exposed to the light reflected from the fingerprint. Some of the sensor pixels SS may effectively cope with a misalignment when placed around the light transmission area A as well as when placed in it.

The resolution of the image sensor ISS may be higher than or equal to the screen resolution of the display panel DPNL so as to enable fingerprint recognition in a fingerprint authentication process. The area of the sensor pixels SS exposed to light is equal to or smaller than the light transmission area so that one or more sensor pixels SS are placed within the light transmission area A. When the length of a display pixel PIX is denoted by "PD", the length of a sensor pixel SS is denoted by "PS", and the length of a light transmission area A is denoted by "PA", the relationship among them may be expressed by PD≥PS and PA≥PS. Here, the lengths may be measured along the X-axis or Y-axis.

The screen of the display panel DPNL comprises a pixel array that reproduces an input image. The pixel array comprises a plurality of data lines, a plurality of gate lines intersecting the data lines, and display pixels PIX arranged in a matrix. Each display pixel may be divided into a red subpixel, a green subpixel, and a blue subpixel to produce colors, and may further comprise a white subpixel. Each subpixel comprises an OLED. In at least some part, e.g., the sensing area SA, of the screen, each display pixel PIX has sensor pixels SS by which light is received. The display panel DPNL is required to have a resolution of 300 DPI (dots per inch) or greater, preferably, 400 DPI or greater, so as to enable fingerprint recognition.

In the electroluminescent display device, compensation circuits for compensating for differences in driving characteristics between pixels may be divided into internal compensation circuits and external compensation circuits. Using the internal compensation circuit placed in each pixel, the pixel circuit internally and automatically compensates for threshold voltage variations between driving elements by sampling the threshold voltage of the driving elements and adding the threshold voltage to data voltages for pixel data to drive the pixels. The external compensation circuit compensates for changes in the driving characteristics of each pixel by sensing electrical characteristics of the driving elements and modulating pixel data of an input image based on the sensing results. The display panel DPNL may comprise an internal compensation circuit or an external compensation circuit.

Figure 7:
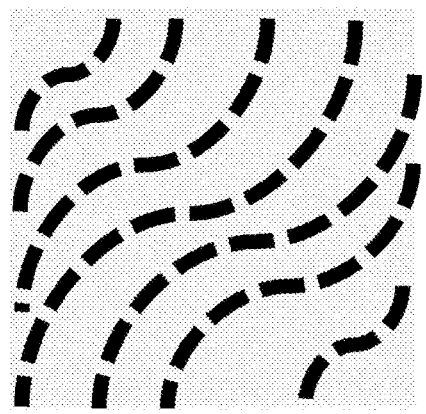
FIG. 7 is a view schematically showing a fingerprint pattern image obtained when light is received by an image sensor through the light transmission areas within the display pixels shown in FIGS. 5 and 6.

By reproducing data converted from the image sensor ISS when a fingerprint touches on the transparent substrate CP, an intermittent fingerprint pattern is obtained as shown in FIG. 7 because the light transmission areas A are separated for each display pixel PIX. Although this fingerprint pattern is less clear than the actual fingerprint of the user, it has no problem with fingerprint recognition because the resolution of the display panel DPNL is greater than 300 DPI, which is the minimum resolution required for fingerprint recognition.

Figure 8:
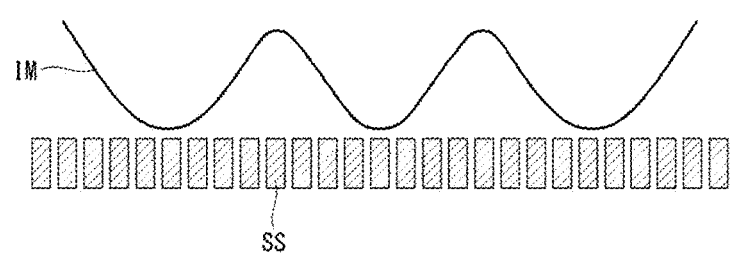
FIG. 8 is a view showing an example in which all sensor pixels in the image sensor are situated beneath a fingerprint.
Figure 9:
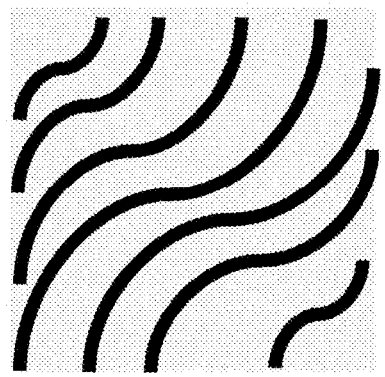
FIG. 9 is a view schematically showing a fingerprint pattern image obtained from the image sensor of FIG. 8.

With all sensor pixels SS situated beneath a fingerprint IM, as in the example of FIG. 8, a clear fingerprint pattern may be obtained without breaks, as illustrated in FIG. 9. In the case of FIG. 8, however, there are no display pixels in the area where the fingerprint touches, and therefore fingerprint sensing on the screen is not possible. On the contrary, in the present disclosure, the sensor pixels are exposed to light through tiny light transmission areas within the display pixels, thereby enabling fingerprint sensing on the screen where an input image is displayed.

Figure 10:
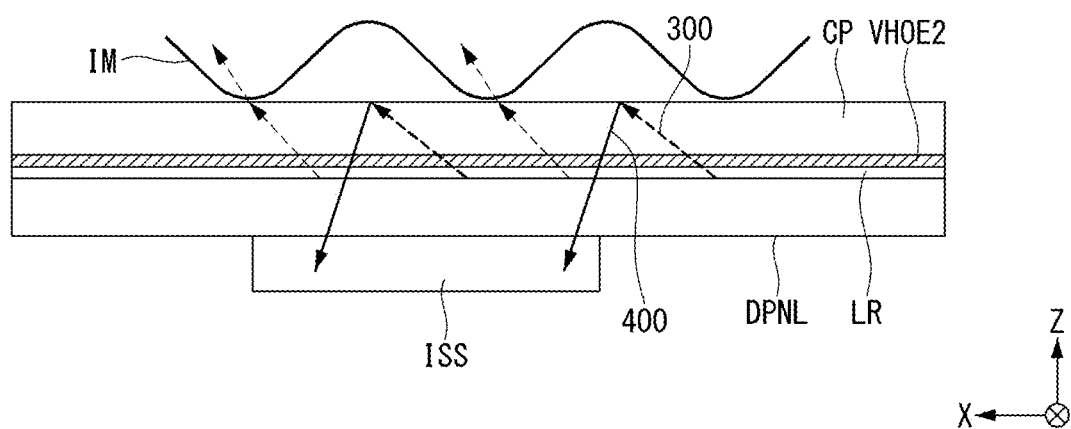
FIG. 10 is a cross-sectional view of an electroluminescent display device according to a second exemplary aspect of the present disclosure.

FIG. 10 is a cross-sectional view of an electroluminescent display device according to a second aspect of the present disclosure. Components in FIG. 10 that are similar to those in the foregoing exemplary aspect are denoted by the same reference numerals, and detailed descriptions of them will be omitted.

Referring to FIG. 10, the transparent substrate CP, a light-exiting element VHOE2, and the low refractive index layer LR are stacked on the top of the display panel DPNL. The low refractive index layer LR is bonded onto the display panel DPNL. Unlike the aspect illustrated in FIG. 4, this exemplary aspect illustrates a cross-sectional structure of a display device from which the light source LS and the light-entering element CHOE are eliminated.

The display pixels PIX disposed in the sensing area SA of the display panel DPNL operate as light sources in sensor mode and emit light with a preset brightness. In display mode, like other pixels PIX, the display pixels PIX disposed in the sensing area SA emit light with a brightness corresponding to a gray level of pixel data of an input image to reproduce the input image.

The light-exiting element VHOE2 refracts the light from the display pixels PIX at an angle greater than the total reflection critical angle of the transparent substrate CP by using a holographic pattern, thereby inducing a total reflection within the transparent substrate CP and refracting part of the light towards the image sensor ISS.

The image sensor ISS is bonded to the bottom of the display panel DPNL. The image sensor ISS is situated opposite the transparent substrate CP, light-exiting element VHOE2, and low refractive index layer LR, with the display panel DPNL in between. Light reflected from a fingerprint is received by the image sensor ISS through the light transmission areas A on the display panel DPNL. Each sensor pixel SS of the image sensor ISS comprises a photosensor that converts light into an electrical signal, and converts the light reflected from the fingerprint to a voltage and then converts the voltage to digital data by amplifying the voltage.

To secure a path of light that passes through the display panel DPNL and travels towards the image sensor ISS, light transmission areas A are formed in the display pixels PIX on the display panel DPNL, as shown in FIGS. 5 and 6. A light transmission area A may be formed in each of the display pixels PIX in at least some part, e.g., the sensing area SA, of the screen. The display panel DPNL is required to have a resolution of 300 DPI (dots per inch) or greater, preferably, 400 DPI or greater, so as to enable fingerprint recognition.

The resolution of the image sensor ISS is required to be greater than or equal to the screen resolution of the display panel DPNL, so as to enable fingerprint recognition in a fingerprint authentication process. The area of the sensor pixels SS exposed to light is equal to or smaller than the light transmission area so that one or more sensor pixels SS are placed within the light transmission area A. When the length of a display pixel PIX is denoted by "PD", the length of a sensor pixel SS is denoted by "PS", and the length of a light transmission area A is denoted by "PA", the relationship among them may be expressed by PD≥PS and PA≥PS. Here, the lengths may be measured along the X-axis or Y-axis.

Figure 11:
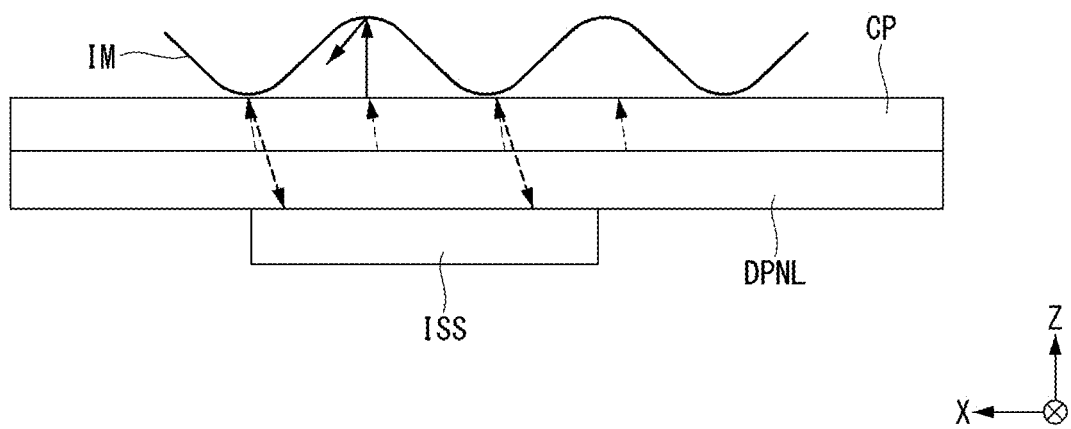
FIG. 11 is a cross-sectional view of an electroluminescent display device according to a third exemplary aspect of the present disclosure.

FIG. 11 is a cross-sectional view of an electroluminescent display device according to a third exemplary aspect of the present disclosure. Components in FIG. 11 that are similar to those in the foregoing exemplary aspect are denoted by the same reference numerals, and detailed descriptions of them will be omitted.

Referring to FIG. 11, the transparent substrate CP is bonded onto the display panel DPNL. Unlike the exemplary aspect illustrated in FIG. 10, the light-exiting element VHOE2 and the low refractive index layer LR are eliminated in this exemplary aspect.

The display pixels PIX disposed in the sensing area SA of the display panel DPNL operate as light sources in sensor mode and emit light with a preset brightness. In display mode, like other pixels PIX, the display pixels PIX disposed in the sensing area SA emit light with a brightness corresponding to a gray level of pixel data of an input image to reproduce the input image.

The image sensor ISS is bonded onto a substrate of the display panel DPNL. Light reflected from a fingerprint is received by the image sensor ISS through the light transmission areas A on the display panel DPNL. Each sensor pixel SS of the image sensor ISS comprises a photosensor that converts light into an electrical signal, and converts the light reflected from the fingerprint to a voltage and then converts the voltage to digital data by amplifying the voltage.

In this exemplary aspect, where the light-exiting element VHOE2 is not provided, the light from the display pixels PIX is not totally reflected within the transparent substrate CP but reflected from the fingerprint through the transparent substrate CP. The light reflected from the fingerprint enters the image sensor ISS. The amount of light reflected from the ridges of the fingerprint and received by the image sensor ISS is larger than the amount of light reflected from the valleys of the fingerprint. The image sensor ISS may sense a fingerprint pattern by the difference in light reflectance between fingerprint ridges and valleys.

To secure a path of light that passes through the display panel DPNL and travels towards the image sensor ISS, light transmission areas A are formed in the display pixels PIX on the display panel DPNL, as shown in FIGS. 5 and 6. A light transmission area A may be formed in each of the display pixels PIX in at least some part, e.g., the sensing area SA, of the screen. The display panel DPNL is required to have a resolution of 300 DPI (dots per inch) or greater, preferably, 400 DPI or greater, so as to enable fingerprint recognition.

The resolution of the image sensor ISS is required to be higher than or equal to the screen resolution of the display panel DPNL, so as to enable fingerprint recognition in a fingerprint authentication process. The area of the sensor pixels SS exposed to light is equal to or smaller than the light transmission area so that one or more sensor pixels SS are placed within the light transmission area A. When the length of a display pixel PIX is denoted by "PD", the length of a sensor pixel SS is denoted by "PS", and the length of a light transmission area A is denoted by "PA", the relationship among them may be expressed by PD≥PS and PA≥PS.

Figure 12:
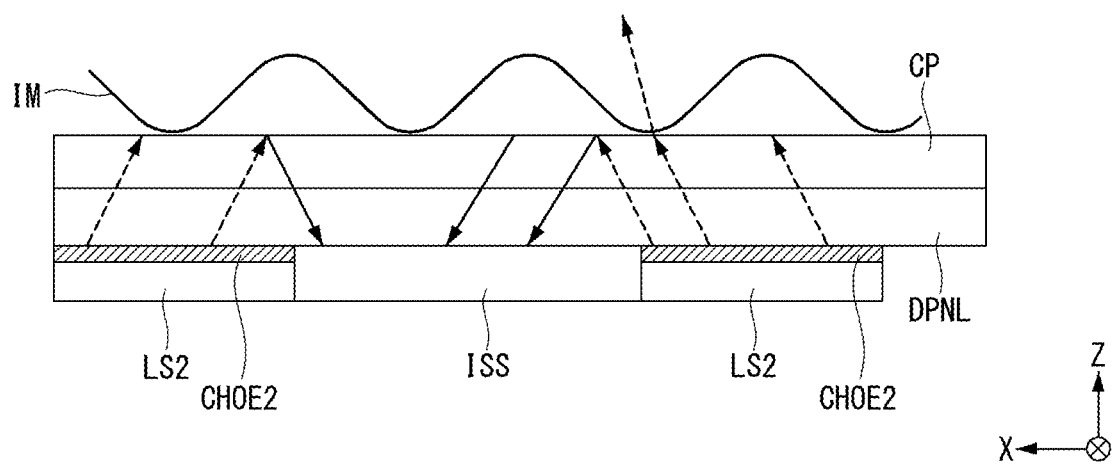
FIG. 12 is a cross-sectional view of an electroluminescent display device according to a fourth exemplary aspect of the present disclosure.

FIG. 12 is a cross-sectional view of an electroluminescent display device according to a fourth exemplary aspect of the present disclosure. Components in FIG. 12 that are similar to those in the foregoing exemplary aspect are denoted by the same reference numerals, and detailed descriptions of them will be omitted.

Referring to FIG. 12, the transparent substrate CP is bonded onto the top of the display panel DPNL. One or more light sources LS2 and the image sensor ISS are placed at the bottom of the display panel DPNL.

A light-entering element CHOE2 is bonded between the light source LS2 and a substrate of the display panel DPNL. The light-entering element CHOE2 is placed between the light source LS2 and the transparent substrate CP and refracts light from the light source LS2 at an angle of total reflection within the transparent substrate CP. The light that has passed through the light-entering element CHOE2 is transmitted through the light transmission areas A on the display panel DPNL and totally reflected within the transparent substrate CP. While the light on the valleys of the fingerprint is reflected, the light on the ridges of the fingerprint is transmitted out.

The image sensor ISS is bonded to the bottom of the display panel DPNL. Light reflected from a fingerprint is received by the image sensor ISS through the light transmission areas A on the display panel DPNL. Each sensor pixel SS of the image sensor ISS comprises a photosensor that converts light into an electrical signal, and converts the light reflected from the fingerprint to a voltage and then converts the voltage to digital data by amplifying the voltage.

Figure 13:
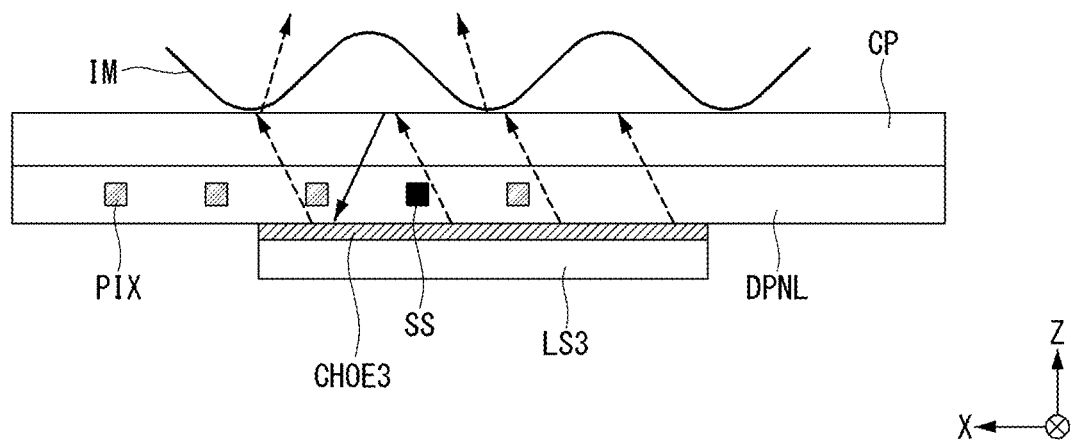
FIG. 13 is a cross-sectional view of an electroluminescent display device according to a fifth exemplary aspect of the present disclosure.

FIG. 13 is a cross-sectional view of an electroluminescent display device according to a fifth exemplary aspect of the present disclosure. Components in FIG. 13 that are similar to those in the foregoing exemplary aspect are denoted by the same reference numerals, and detailed descriptions of them will be omitted.

Referring to FIG. 13, the transparent substrate CP is bonded onto the top of the display panel DPNL. One or more light sources LS3 are placed at the bottom of the display panel DPNL.

A light-entering element CHOE3 is bonded between the light source LS3 and a substrate of the display panel DPNL. The light-entering element CHOE3 is placed between the light source LS3 and the transparent substrate CP and refracts light from the light source LS3 at an angle of total reflection within the transparent substrate CP. The light that has passed through the light-entering element CHOE3 is transmitted through the light transmission areas A on the display panel DPNL and totally reflected within the transparent substrate CP. While the light on the valleys of the fingerprint is reflected, the light on the ridges of the fingerprint is transmitted out.

When the OLEDs of the display pixels PIX are exposed to light by a reverse bias applied to the OLEDs, the OLEDs generate a photocurrent. When a reverse bias is applied to the OLEDs in sensor mode, the OLEDs of the display pixels operate as photosensors. Using this, in sensor mode, light reflected from a fingerprint is photoelectrically converted by the OLEDs, i.e., photosensors, to which the reverse bias is applied. In another exemplary aspect, one or more photosensors may be placed in each of the light transmission areas A within the pixel array on the display panel DPNL. Accordingly, in this exemplary aspect, fingerprint sensing is enabled on any position on the screen by using display pixels or embedding photo sensors in the pixel array, rather than bonding an image sensor onto the display panel DPNL. Since a fingerprint can be sensed on the screen where an image is displayed, when a user's finger touches the icon of an application or content or an executable/playable file on the screen that requires fingerprint authentication, the user may gain access to that application, content or file after user authentication.

Figure 14:
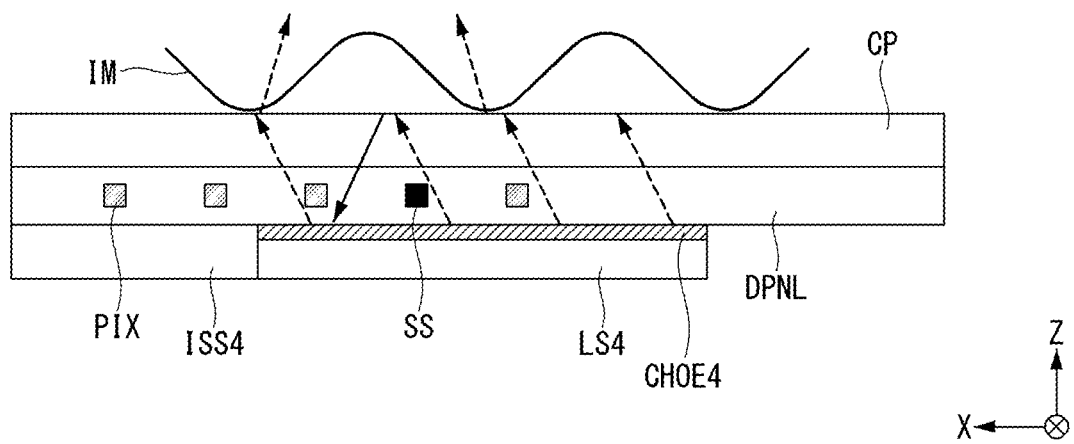
FIG. 14 is a cross-sectional view of an electroluminescent display device according to a sixth exemplary aspect of the present disclosure.

FIG. 14 is a cross-sectional view of an electroluminescent display device according to a sixth exemplary aspect of the present disclosure. Components in FIG. 14 that are similar to those in the foregoing exemplary aspect are denoted by the same reference numerals, and detailed descriptions of them will be omitted.

Referring to FIG. 14, the transparent substrate CP is bonded onto the top of the display panel DPNL. An image sensor ISS4 and one or more light sources LS4 are placed at the bottom of the display panel DPNL.

A light-entering element CHOE4 is bonded between the light source LS4 and a substrate of the display panel DPNL. The light-entering element CHOE4 is placed between the light source LS4 and the transparent substrate CP and refracts light from the light source LS4 at an angle of total reflection within the transparent substrate CP. The light that has passed through the light-entering element CHOE4 is transmitted through the light transmission areas A on the display panel DPNL and totally reflected within the transparent substrate CP. While the light on the valleys of the fingerprint is reflected, the light on the ridges of the fingerprint is transmitted out.

The image sensor ISS4 is bonded to the bottom of the display panel DPNL. Light reflected from a fingerprint is received by the image sensor ISS4 through the light transmission areas A on the display panel DPNL. Each sensor pixel SS of the image sensor ISS4 comprises a photosensor that converts light into an electrical signal, and converts the light reflected from the fingerprint to a voltage and then converts the voltage to digital data by amplifying the voltage.

Like the foregoing exemplary aspect in FIG. 13, a reverse bias may be applied to the OLEDs of the display pixels PIX in the pixel array on the display panel DPNL, or photosensors may be embedded in the pixel array. In this exemplary aspect, fingerprint sensing is enabled on any position on the screen.

Fingerprint patterns may be sensed using the sensor pixels SS embedded in the pixel array on the display panel DPNL, and finger veins may be sensed using the image sensor ISS4. In this case, the fingerprint patterns and finger vein patterns, which are simultaneously sensed, are compared with previously stored fingerprint patterns and finger vein patterns of the user. Thus, the fingerprint patterns may be verified based on results of a fingerprint vein authentication, thereby allowing more secure user authentication. Also, fingerprint patterns may be sensed using the image sensor ISS4, and finger veins may be sensed using the sensor pixels SS embedded in the pixel array.

Figure 15:
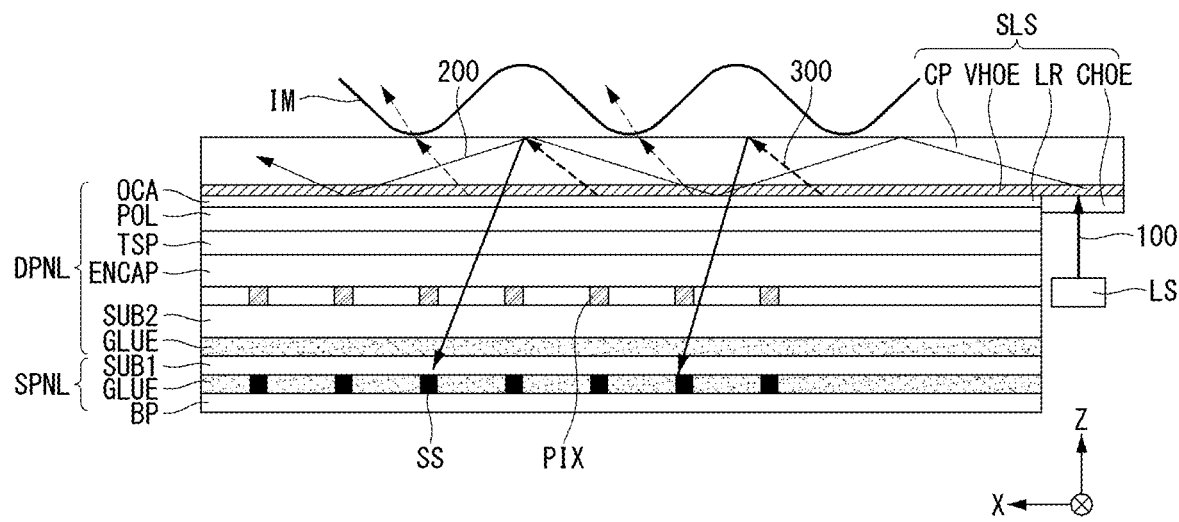
FIG. 15 is a cross-sectional view of an electroluminescent display device according to a seventh exemplary aspect of the present disclosure.
Figure 16:
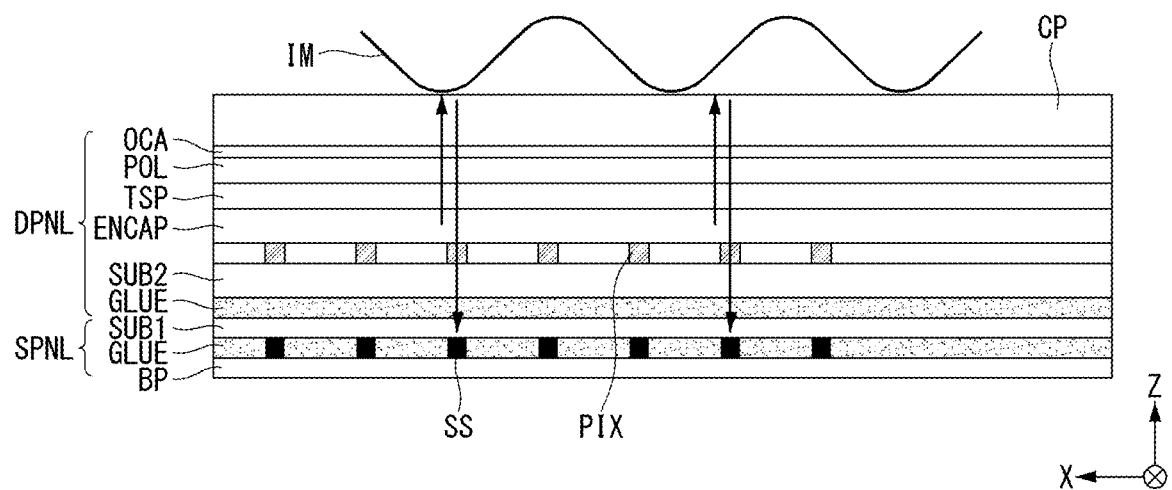
FIG. 16 is a cross-sectional view of an electroluminescent display device according to an eighth exemplary aspect of the present disclosure.
Figure 17:
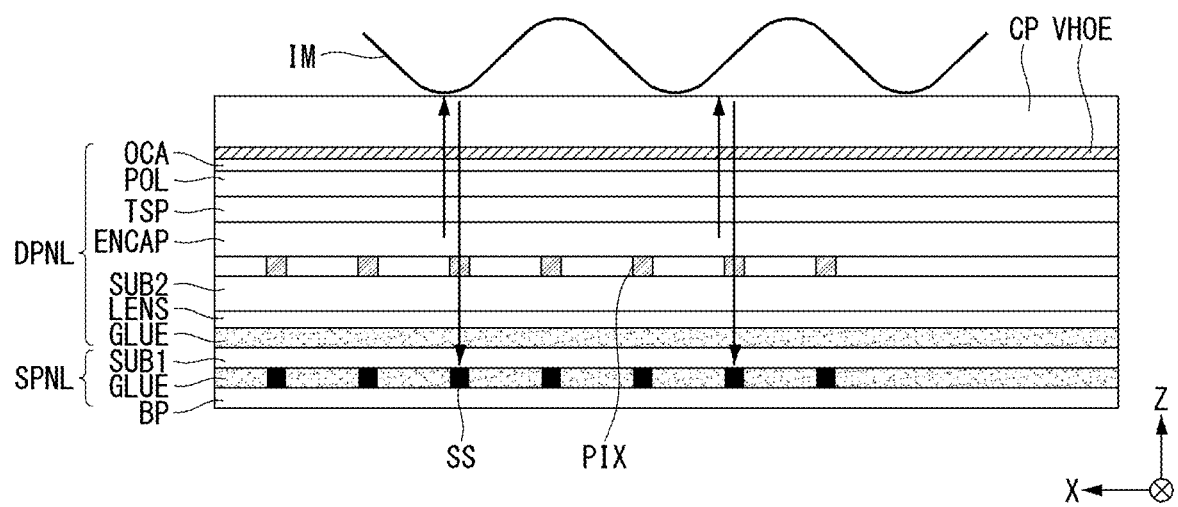
FIG. 17 is a cross-sectional view of an electroluminescent display device according to a ninth exemplary aspect of the present disclosure.

The images sensor ISS to ISS4 may be implemented as any well-known image sensors or as a sensor panel as in FIGS. 15 to 17.

The sensor panel SPNL illustrated in FIGS. 15 to 17 may be implemented by a TFT (thin-film transistor) array process on the display panel DPNL. Thus, the sensor panel SPNL may be made on the manufacturing line of the display panel DPNL. The TFTs in the TFT array on the display panel DPNL and sensor panel SPNL may be implemented as one or more of the following: a TFT (oxide TFT) comprising oxide semiconductor, a TFT (a-Si TFT) comprising amorphous silicon (a-Si), and a TFT (LTPS TFT) comprising low-temperature polysilicon (LTPS). The TFTs may be implemented as MOSFET (metal oxide semiconductor field effect transistor). The TFTs may be implemented as either n-type transistors (NMOS) or p-type transistors (PMOS) or a combination thereof.

FIG. 15 is a cross-sectional view of an electroluminescent display device according to a seventh exemplary aspect of the present disclosure.

Referring to FIG. 15, the display panel DPNL comprises a pixel array formed on a substrate SUB2, an encapsulation substrate ENCAP covering the pixel array, a touch sensor panel TSP placed on the encapsulation substrate ENCAP, and a polarizing film POL bonded onto the touch sensor panel TSP. The pixel array comprises a TFT array and an OLED array connected to the TFT array. The TFT array comprises data lines, gate lines, and TFTs. The OLED array comprises the OLEDs of pixels connected to the TFTs. The pixel array may be formed on the front side of the substrate SUB2, and the sensor panel SPNL may be bonded with an adhesive GLUE to the back side of the substrate SUB2.

The directional light source device SLS is placed on the display panel DPNL. The light-exiting element VHOE and the low refractive index layer LR are placed on the display panel DPNL. The low refractive index layer LR may be bonded onto the display panel DPNL with an adhesive OCA. An infrared filter may be added between the sensor panel SPNL and the user's fingerprint, in order to increase the selectivity of infrared wavelengths when the light source LS generates light in infrared wavelengths. For example, the infrared filter may be placed in the light transmission areas A on the display panel DPNL, as shown in FIGS. 5 and 6.

Figure 21:
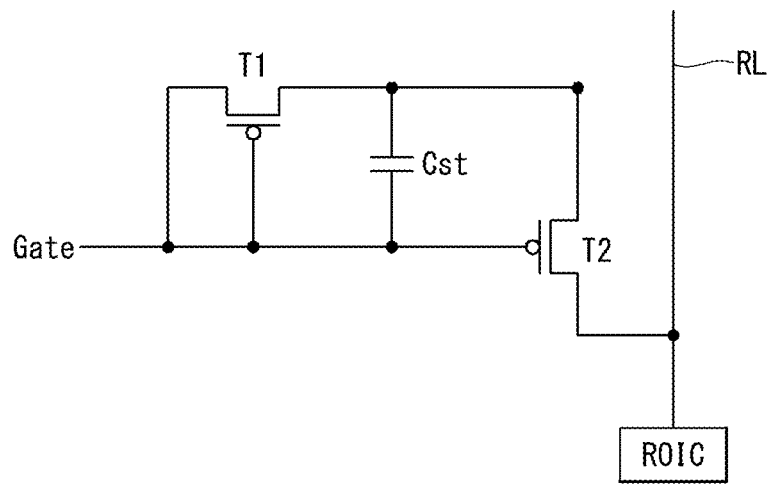
FIG. 21 is a circuit diagram showing an example of a sensor pixel.

Sensor pixels are placed on the sensor panel SPNL. As illustrated in FIG. 21, the sensor pixels each may comprise a photodiode, a switching element, a capacitor, etc. The photodiode may be implemented as a TFT or a PIN diode.

The sensor panel SPNL comprises a plurality of sensor pixels SS formed on a substrate SUB1 and a back plate BP with the sensor pixels SS provided between it and the substrate SUB1. The back plate BP may be bonded with an adhesive GLUE to the substrate SUB1. The sensor pixels SS may be formed on the front side of the substrate SUB1. The back side of the substrate SUB2 is bonded to the back side of the substrate SUB1 of the display panel DPNL.

When using a flexible substrate such as a polyimide (PI) film substrate as the substrate SUB1 of the sensor panel SPNL, a carrier substrate supporting the flexible substrate is required during the manufacturing process of the sensor pixels. By bonding the back plate BP to the surface of the flexible substrate where the sensor pixels are formed, before the flexible substrate is separated from the carrier substrate after completion of the sensor pixel manufacturing process, the sensor panel SPNL may be easily bonded to the display panel DPNL after separation of the carrier substrate. By using a face seal adhesive (FSA) as the adhesive GLUE used for bonding the back plate BP to the substrate SUB1 and the adhesive GLUE used for bonding the display panel DPNL to the substrate SUB1, it is possible to effectively prevent moisture penetration into the display panel DPNL.

FIG. 16 is a cross-sectional view of an electroluminescent display device according to an eighth exemplary aspect of the present disclosure. Components in FIG. 16 that are similar to those in the exemplary aspect in FIG. 15 are denoted by the same reference numerals, and detailed descriptions of them will be omitted.

Referring to FIG. 16, the transparent substrate CP is bonded with an adhesive OCA onto the display panel DPNL. The components in the directional light source device SLS, except the transparent substrate CP, may be eliminated.

The display pixels PIX operate as light sources in sensor mode and emit light with a preset brightness. In display mode, like other pixels PIX, the display pixels PIX emit light by a forward bias applied to it, with a brightness corresponding to a gray level of pixel data of an input image to reproduce the input image.

The light from the display pixels PIX is not totally reflected within the transparent substrate CP but reflected from the fingerprint through the transparent substrate CP. The light reflected from the fingerprint enters the sensor pixels SS on the sensor panel SPNL. The amount of light reflected from the ridges of the fingerprint and received by the sensor pixels SS is larger than the amount of light reflected from the valleys of the fingerprint. The sensor panel SPNL may sense a fingerprint pattern by the difference in light reflectance between fingerprint ridges and valleys.

FIG. 17 is a cross-sectional view of an electroluminescent display device according to a ninth exemplary aspect of the present disclosure. Components in FIG. 17 that are similar to those in the exemplary aspects in FIGS. 15 and 16 are denoted by the same reference numerals, and detailed descriptions of them will be omitted.

Referring to FIG. 17, the transparent substrate CP is bonded with an adhesive OCA onto the display panel DPNL. The components in the directional light source device SLS, except the transparent substrate CP, may be eliminated. At least some of the display pixels PIX operate as light sources in sensor mode. Accordingly, the light source implementation method and fingerprint sensing principle in this exemplary aspect are substantially identical to those in the exemplary aspect in FIG. 16.

Figure 18A:
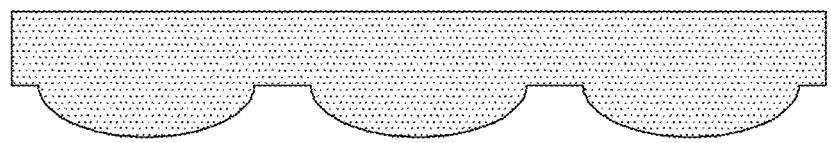
FIGS. 18A and 18B are cross-sectional views showing in detail a light focusing element shown in FIG. 17.
Figure 18B:
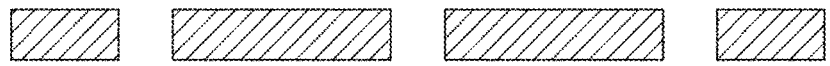

In this exemplary aspect, the electroluminescent display device further comprises a light focusing element LENS placed between the display panel DPNL and the sensor panel SPNL. The light focusing element LENS may be bonded between the display panel PNL and the sensor panel SPNL with an adhesive. The light focusing element LENS may increase the light reception efficiency of the sensor pixels SS by allowing light entering through the light transmission areas A on the display panel DPNL to be focused on the sensor pixels SS. The light focusing element LENS may be implemented as a lens as in FIG. 18A or a pin hole array as in FIG. 18B.

Figure 19:
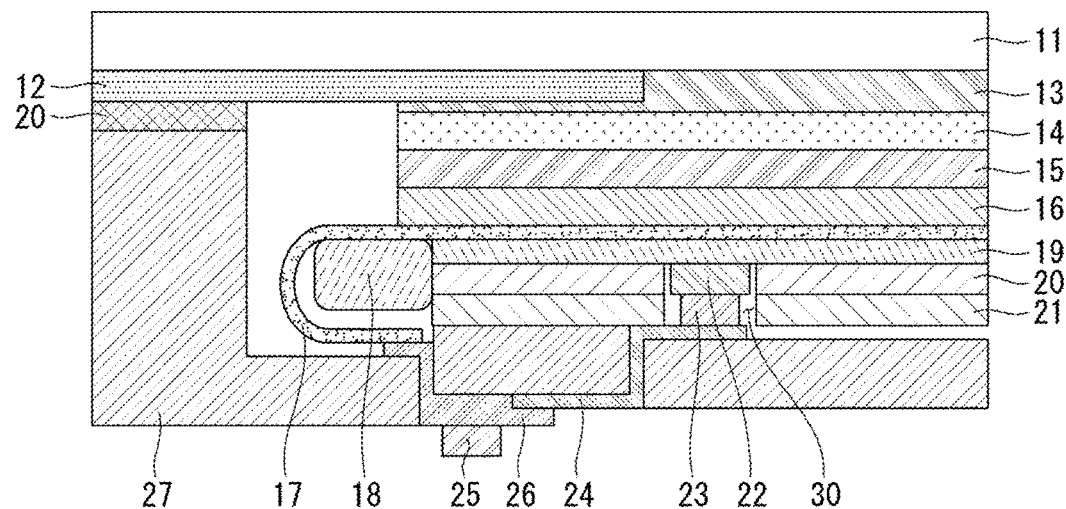
FIGS. 19 and 20 are cross-sectional views showing examples in which a display panel of an electroluminescent display device according to an exemplary aspect of the present disclosure implemented on a flexible substrate.
Figure 20:
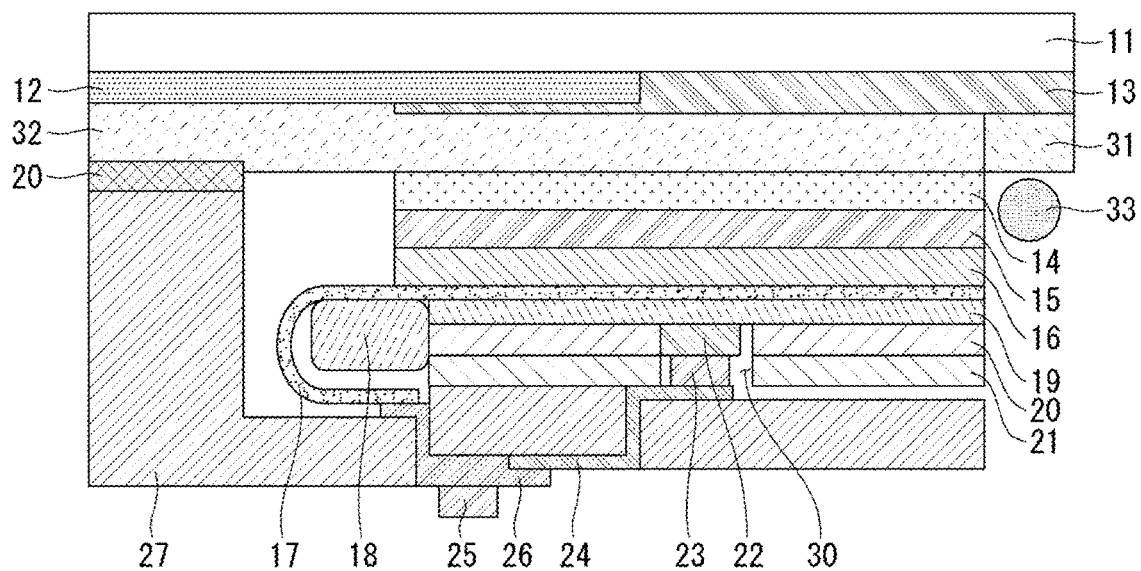

FIGS. 19 and 20 are cross-sectional views showing examples in which a display panel of an electroluminescent display device according to an exemplary aspect of the present disclosure is implemented on a flexible substrate.

FIG. 19 depicts an example in which the directional light source device SLS is not present. Referring to FIG. 19, the electroluminescent display device comprises a transparent substrate 11 bonded onto the display panel, an image sensor 23 placed under the display panel, and a drive integrated circuit (hereinafter, "IC") 25 for driving the display panel.

The display panel comprises an organic thin film 17 bonded onto the back plate 19, a pixel array 16 formed on the organic thin film 17, a touch sensor panel 15 placed on the pixel array 16, and a polarizing film 14 bonded onto the touch sensor panel 15. The above-described light transmission areas A are formed in the display pixels PIX.

The polarizing film 14 improves outdoor visibility by preventing reflection of external light on the display panel. The polarizing film 14 may comprise a circular polarizer (or λ/4 plate). The polarizing film 14 is bonded onto the transparent substrate 11 with an adhesive 13, for example, OCA.

The back plate 19 may be a PET (polyethylene terephthalate) substrate. The back plate 19 prevents moisture permeation to keep the pixel array 16 from getting exposed to humidity and supports the pixel array 16. The organic thin film 17 may be a thin polyimide (PI) film substrate. Multiple buffer layers, which are insulating materials that are not shown, may be formed on the organic thin film 17. Wiring lines for supplying power or signals applied to the pixel array 16 and the touch sensor panel 15 may be formed on the organic thin film 17.

The pixel array 16 comprises data lines, gate lines intersecting the data lines, and pixels arranged in a matrix to make up a screen that reproduces an input image. Each pixel comprises a light-emitting element. In an example, each pixel may comprise an OLED and a drive circuit for the OLED. The data lines on the pixel array 16 are connected to the drive IC 25 and receive data signals from the drive IC 25. The touch sensor panel 15 is driven by a touch sensor driver to detect touch input, and transmits the coordinates and identification code (ID) of each touch input to a host system.

The image sensor 23 converts light entering through the light transmission areas on the display panel to an electrical signal to output fingerprint data or finger vein data. The image sensor 23 is bonded below the pixel array 16 without making an alteration to the display panel's structure, and therefore has no effect on bezel size. The image sensor 23 is bonded to the display panel so that a receiving portion of the image sensor 23 faces the transparent substrate 11. The presence of air gaps between the image sensor 23 and the display panel may significantly deteriorate sensor performance or make fingerprint sensing impossible. Accordingly, the receiving portion of the image sensor 23 is bonded to the back plate 19 of the display panel with an adhesive 22. A lens for increasing light reception efficiency may be provided at the receiving portion of the image sensor 23.

A foam pad 20 and a metallic layer 21 may be stacked on the back plate 19. The foam pad 20 is made of a foam resin and absorbs vibration or impact. The metallic layer 21 is a layer of metal, for example, Cu, that blocks electromagnetic interference (EMI). The sensor panel SPNL may be stacked on the back plate 19.

A hole 30 exposing the back plate 19 is formed in the foam pad 20 and the metallic layer 21 so that the image sensor 23 is bonded to the back plate 19. The image sensor 23 is placed within the hole 30, with its receiving portion bonded to the back plate 19. A mid-frame 27 may have a hole exposing the hole in which the image sensor 23 is inserted. As the image sensor 23 is bonded to the back plate 19, with the image sensor 23 inserted through the hole in the foam pad 20 and the back plate 19, a path of light may be secured between a fingerprint and the image sensor 23, and the structure of the display device may be made slimmer.

The drive IC 25 drives the pixels by converting data of an input image to data signals and outputting them to the data lines on the pixel array. The drive IC 25 may comprise a touch sensor driver. The drive IC 25 is mounted on a second flexible substrate 26.

One end of a first flexible substrate 24 is connected to the image sensor 23 on the inner side of the bottom of the mid-frame 27. The other end of the first flexible substrate 24 is exposed to the outer side of the bottom of the mid-frame 27 through a first hole of the mid-frame 27. The other end of the first flexible substrate 24 is connected to the second flexible substrate 26. The first and second flexible substrates 24 and 26 each may be implemented as an FPCB (flexible printed circuit board). The first and second flexible substrates 24 and 26 may be separated from each other if they do not need to be synchronized.

The mid-frame 27 may be made with resin such as plastic. The mid-frame 27 accommodates the display panel, the image sensor 23, the drive IC 25, etc. The top of a sidewall of the mid-frame 27 may be bonded to the transparent substrate 11 with double-sided tape. A decorative film 12 may be bonded to the transparent substrate 11. Image, logo, text, etc. may be printed on the decorative film 12.

One end of the organic thin film 17 is bent towards the rear of the display panel and connected to one end of the second flexible substrate 26. A mandrel 18 is bonded to the sides of the back plate 19 and foam pad 20 and supports the bent portion of the organic thin film 17.

The other end of the second flexible substrate 26 is exposed to the outer side of the bottom of the mid-frame 27 through a second hole of the mid-frame 27 and connected to the other end of the first flexible substrate 24. The drive IC 25 is mounted on the second flexible substrate 26 which is exposed through the outer side of the bottom of the mid-frame 27.

The first flexible substrate 24 connects the image sensor 23 to the host system's mainboard and/or the drive IC 25. The host system is connected to the image sensor 23 through the first flexible substrate 24 to exchange data with the image sensor 23 and control the image sensor 23.

The host system may be any one of the following: a television system, a set-top box, a navigation system, a personal computer (PC), a home theater system, a mobile system, a wearable system, and a virtual reality system. The host system transmits pixel data of an input image to the drive IC 25. The host system executes an application linked to coordinates from the touch sensor driver, and performs user authentication based on fingerprint information received from the image sensor 23.

FIG. 20 depicts an example in which the directional light source device SLS is bonded onto the display panel. Components in FIG. 20 that are similar to those in the exemplary aspect in FIG. 19 are denoted by the same reference numerals, and detailed descriptions of them will be omitted.

Referring to FIG. 20, a display device of this disclosure further comprises a directional light source device placed on the display panel. The directional light source device comprises a light source 33, a light-entering element 31, a transparent substrate 11, and a light-exiting element 32. The directional light source device may further comprise a low refractive index layer (not shown).

The light source 33 is placed under one edge of the transparent substrate 11. The light-entering element 31 and the light-exiting element 32 are placed between the transparent substrate 11 and the display panel. The light-entering element 31 and the light-exiting element 32 are bonded to the transparent substrate 11, and the polarizing film 14 of the display panel is bonded to the light-exiting element 32.

Light from the light source 33 is refracted at an angle of total reflection within the transparent substrate 11 and propagates within the transparent substrate 11. The light-exiting element 32 adjusts the angle of part of the light that is totally reflected within the substrate. The light, with its angle of total reflection narrowed by the light-exiting element 32, may be reflected from the top of the transparent substrate 11, pass through the low refractive index layer and then the light transmission areas A on the display panel, and be projected to the receiving portion of the image sensor 23. The light-entering element 31 and the light-exiting element 32 may be implemented as an optical device comprising a holographic pattern.

FIG. 21 is a circuit diagram showing an example of a sensor pixel SS.

Referring to FIG. 21, a sensor pixel SS comprises a sensor element T1, a switching element T2, and a capacitor Cst. The sensor element T1 and the switching element T2 may be implemented as transistors as shown in FIGS. 22 to 24.

When the sensor element T1 is off, it generates a photocurrent when exposed to light and the capacitor Cst is charged with this current. When a gate signal Gate is applied, the switching element T2 turns on and the voltage of a sensor signal stored in the capacitor Cst is fed to a sensor signal processing circuit ROIC. The sensor signal processing circuit ROIC amplifies the sensor signal, converts it to digital data, and transmits it to the host system.

Figure 22:
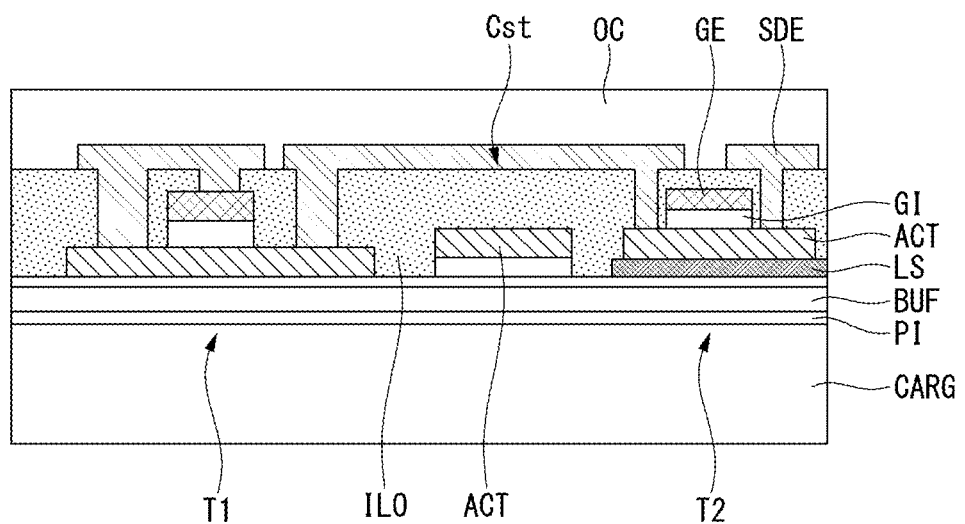
FIGS. 22 to 24 are cross-sectional views showing in stages a manufacturing process of the sensor pixel of FIG. 21.
Figure 23:
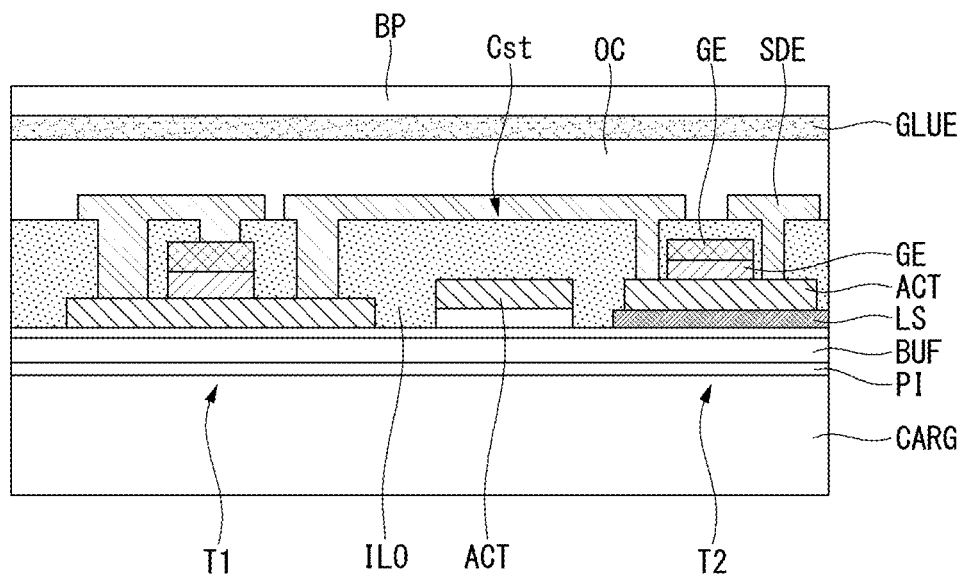
Figure 24:
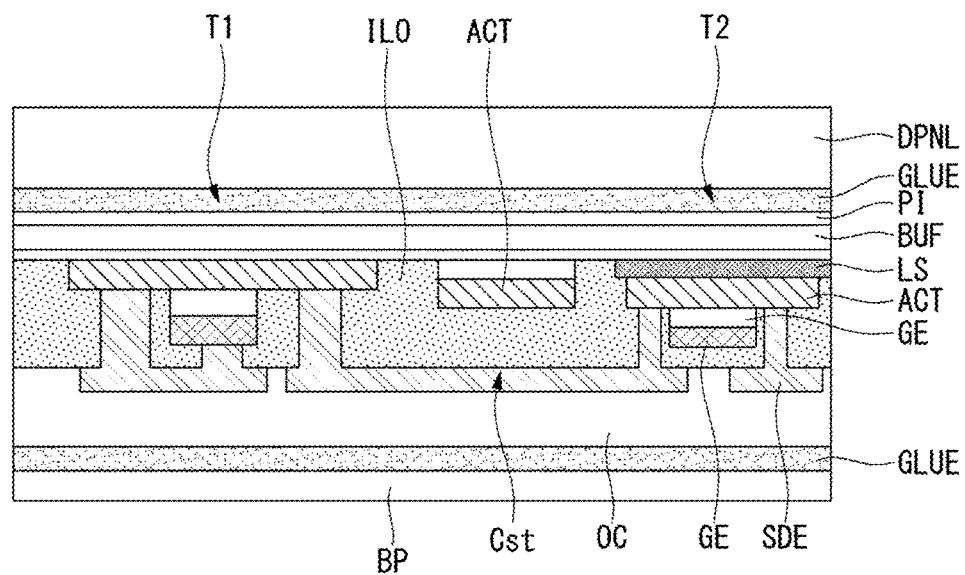

FIGS. 22 to 24 are cross-sectional views showing in stages a manufacturing process of the sensor pixel of FIG. 21.

Referring to FIGS. 22 to 24, the sensor element T1 and the switching element T2 are formed on a carrier substrate CARG. The sensor element T1 and the switching element T2 are implemented as transistors. An organic thin film PI and a sacrifice layer BUF are stacked on the carrier substrate CARG. A light-shielding film LS is formed on the sacrifice layer BUF, and a semiconductor pattern ACT, a gate insulating film GI, a gate metal pattern GE, a source-drain metal pattern SDE, etc. are stacked on top of the light-shielding film LS. An interlayer insulating film ILO insulates the gate metal pattern GE and the source-drain metal pattern SDE. The sensor element T1 and the switching element T2 are covered by a planarization layer OC. The planarization layer OC may be omitted.

As shown in FIG. 23, the back plate BP is bonded to the planarization layer OC with an adhesive GLUE. Next, the carrier substrate CARG and the organic thin film PI are separated in a laser release process. Hereupon, the sacrifice layer BUF is removed. Subsequently, as shown in FIG. 24, the sensor panel is turned upside down and then the display panel DPNL is bonded onto the organic thin film PI with an adhesive GLUE. The display panel DPNL may be bonded onto the sensor panel SPNL by a laminating process.

Figure 25:
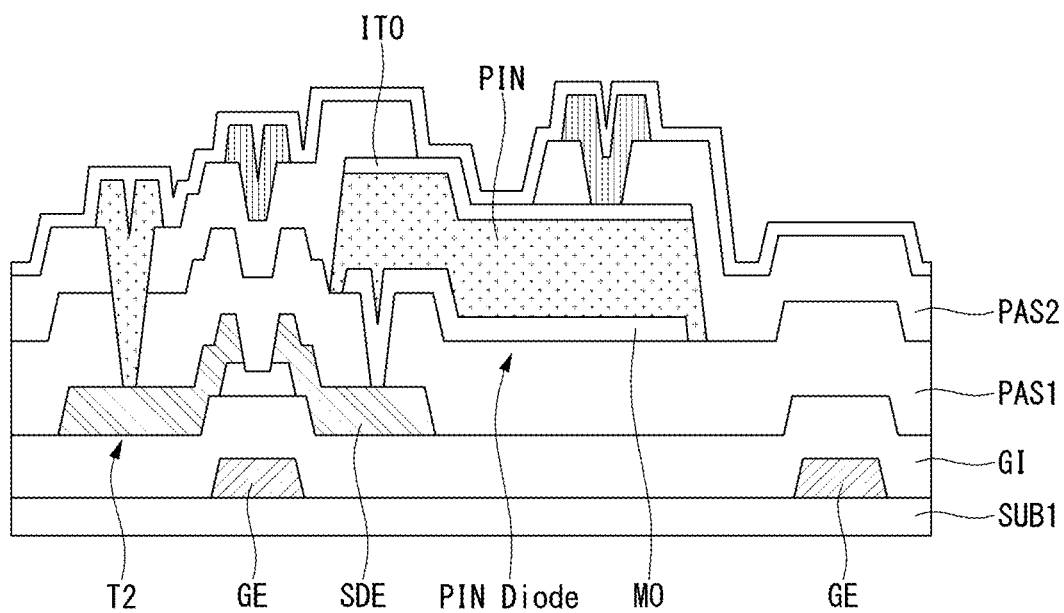
FIG. 25 is a cross-sectional view showing an example in which a sensor element is implemented as a PIN diode.

FIG. 25 is a cross-sectional view showing an example in which the sensor element T1 is implemented as a PIN diode.

Referring to FIG. 25, a semiconductor layer PIN of the PIN diode has a p+ layer, an intrinsic semiconductor layer, and an n+ layer that are stacked on top of each other. One electrode of the PIN diode is connected to the switching element T2.

The switching element T2 may be formed as a bottom gate transistor on the substrate SUB1. The switching element T2 comprises a gate formed from a gate metal pattern GE, a semiconductor pattern overlapping the gate metal pattern GE with a gate insulating film GI in between, and a source and drain formed from a source-drain metal pattern SDE contacting the semiconductor pattern. A first passivation film PAS1 covers the switching element T2, and a second passivation PAS2 covers the PIN diode PIN.

As described above, in the present disclosure, fingerprints may be sensed on the screen by using the sensor pixels embedded in the display panel or placed under the display panel. The light source may be implemented as a directional light source device placed on the display panel or as pixels on the display panel. Since a fingerprint can be sensed on the screen where an image is displayed, when a user's finger touches the icon of an application or content or an executable/playable file on the screen that requires fingerprint authentication, the user may gain access to that application, content or file after user authentication.

The present disclosure may enhance the security of content access based on results of multi-biometric authentication of a user by sensing the user's fingerprint and finger veins simultaneously.

The present disclosure may implement an electroluminescent display device integrated with a fingerprint sensor without making an alteration to the structure or manufacturing process of the display panel, by placing an image sensor at the bottom of the display panel. The present disclosure provides advantages in terms of the narrow bezel design, waterproof design, and design freedom for electroluminescent display devices because it does not require a fingerprint sensor to be built in a bezel area outside the screen or in the home button.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electroluminescent display device integrated with a fingerprint sensor, comprising:
    a display panel comprising a plurality of display pixels, each display pixel disposed in at least some of pixel arrays comprising a light transmission area;
    a transparent substrate attached to a top surface of the display panel;
    a light source disposed under an edge of the transparent substrate;
    a light-entering element and a light-exiting element disposed between the light source and the transparent substrate, wherein the light-entering element and the light-exiting element are formed as a single film and are adjacent to each other; and
    an image sensor attached to a bottom surface of the display panel and comprising a plurality of photosensors,
    wherein, at least one photosensor among the plurality of the photosensors is exposed within the light transmission area, and the image sensor has a resolution higher than or equal to a resolution of the display panel.

2. The electroluminescent display device of claim 1, wherein the light-entering element refracts light from the light source at an angle of total reflection within the transparent substrate; and
    the light-exiting element refracts part of light traveling within the transparent substrate so that the part of the light traveling within the transparent substrate travels towards the display panel through an underside of the transparent substrate.

3. The electroluminescent display device of claim 1, wherein at least some of the display pixels emit light in a sensor mode, and the emitted light from the display pixels is reflected from a fingerprint on the transparent substrate and travels towards the image sensor through the light transmission area.

4. The electroluminescent display device of claim 1, further comprising:
    one or more light source attached to the bottom of the display panel; and
    a light-entering element disposed between the light source and the transparent substrate and refracting light from the light source at an angle of total reflection within the transparent substrate.

5. The electroluminescent display device of claim 1, further comprising a light focusing element disposed between the display panel and the image sensor and focusing light traveling towards the image sensor.

6. The electroluminescent display device of claim 1, further comprising a low refractive index layer disposed between the light-exiting element and the display panel and having a refractive index lower than the light-exiting element.

7. The electroluminescent display device of claim 1, wherein the light-entering element and the light-exiting element include an optical element having a holographic pattern.

8. An electroluminescent display device integrated with a fingerprint sensor, comprising:
    a display panel comprising a plurality of display pixels, each display pixel disposed in at least some of pixel arrays comprising a light transmission area;
    a transparent substrate attached to a top surface of the display panel;
    a light source disposed under an edge of the transparent substrate;
    a light-entering element and a light-exiting element disposed between the light source and the transparent substrate, wherein the light-entering element and the light-exiting element are formed as a single film and are adjacent to each other; and
    an image sensor attached to a bottom surface of the display panel and comprising at least one photosensor exposed within the light transmission area, wherein at least some of the display pixels are driven as photosensors in a sensor mode, or photosensors are embedded in the display panel, and the image sensor has a resolution higher than or equal to a resolution of the display panel.

9. The electroluminescent display device of claim 8, wherein, in a sensor mode, organic light-emitting diodes of at least some of the display pixels operate as photosensors by applying a reverse bias to the organic light-emitting diodes, and in a display mode, the organic light-emitting diodes of at least some of the display pixels having the organic light-emitting diodes display pixel data of an input image by applying a forward bias to the organic light-emitting diodes.

10. The electroluminescent display device of claim 9, wherein the display pixels where the reverse bias is applied sense a fingerprint pattern, and the image sensor senses a finger vein pattern.

11. The electroluminescent display device of claim 8, further comprising a light focusing element disposed between the display panel and the image sensor and focusing light traveling towards the image sensor.

12. An electroluminescent display device integrated with a fingerprint sensor, comprising:

a display panel comprising a plurality of display pixels, each display pixel disposed in at least some of pixel arrays comprising a light transmission area and sensing a fingerprint pattern;
a transparent substrate attached to a top surface of the display panel;
a light source disposed under an edge of the transparent substrate;
a light-entering element and a light-exiting element disposed between the light source and the transparent substrate, wherein the light-entering element and the light-exiting element are formed as a single film and are adjacent to each other; and
an image sensor attached to a bottom surface of the display panel, comprising a plurality of photosensors and sensing a finger vein pattern,
wherein at least one photosensor among the plurality of the photosensors is exposed within the light transmission area, and the image sensor has a resolution at least equal to a resolution of the display panel.

13. The electroluminescent display device of claim 12, wherein the display pixels are applied by a reverse bias when the fingerprint pattern is sensed.

14. The electroluminescent display device of claim 12, further comprising a light focusing element disposed between the display panel and the image sensor and focusing light traveling towards the image sensor.

15. The electroluminescent display device of claim 12, wherein the light-entering element refracts light from the light source at an angle of total reflection within the transparent substrate; and
the light-exiting element refracts part of light traveling within the transparent substrate so that the part of the light traveling within the transparent substrate travels towards the display panel through an underside of the transparent substrate.

16. The electroluminescent display device of claim 12, wherein at least some of the display pixels emit light in a sensor mode, and the emitted light from the display pixels is reflected from a fingerprint on the transparent substrate and travels towards the image sensor through the light transmission area.

17. The electroluminescent display device of claim 12, further comprising:
at least one light source attached to the bottom of the display panel; and
a light-entering element disposed between the light source and the transparent substrate and refracting light from the light source at an angle of total reflection within the transparent substrate.

18. The electroluminescent display device of claim 12, wherein at least some of the display pixels have organic light-emitting diodes operating as photosensors by applying a reverse bias to the organic light-emitting diodes in a sensor mode.

19. The electroluminescent display device of claim 12, wherein at least some of the display pixels having organic light-emitting diodes display pixel data of an input image by applying a forward bias to the organic light-emitting diodes in a display mode.

20. The electroluminescent display device of claim 12, further comprising a low refractive index layer disposed between the light-exiting element and the display panel and having a refractive index lower than the light-exiting element.

* * * * *